(12) United States Patent
Suzawa et al.

(10) Patent No.: US 8,778,729 B2
(45) Date of Patent: Jul. 15, 2014

(54) MANUFACTURING METHOD OF SEMICONDUCTOR DEVICE

(75) Inventors: Hideomi Suzawa, Atsugi (JP); Shinya Sasagawa, Chigasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 481 days.

(21) Appl. No.: 13/192,494

(22) Filed: Jul. 28, 2011

(65) Prior Publication Data

US 2012/0034743 A1 Feb. 9, 2012

(30) Foreign Application Priority Data

Aug. 5, 2010 (JP) ................................. 2010-176291

(51) Int. Cl.
*H01L 21/00* (2006.01)
(52) U.S. Cl.
USPC .......................................... 438/104; 438/163
(58) Field of Classification Search
CPC ..................... H01L 29/7869; H01L 29/78696;
H01L 29/78618; H01L 29/786; H01L
29/1037; H01L 29/7834; H01L 29/7889
USPC ................... 438/104, 151, 155, 156, 163, 164
See application file for complete search history.

(56) References Cited

U.S. PATENT DOCUMENTS

| | | |
|---|---|---|
| 4,902,637 A | 2/1990 | Kondou et al. |
| 5,712,496 A | 1/1998 | Takahashi et al. |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Prins et al., "A Ferroelectric Transparent Thin-Film Transistor," Appl. Phys. Lett., Jun. 17, 1996, vol. 68, No. 25, pp. 3650-3652.

(Continued)

*Primary Examiner* — Stephen W Smoot
*Assistant Examiner* — Sun M Kim
(74) *Attorney, Agent, or Firm* — Eric J. Robinson; Robinson Intellectual Property Law Office, P.C.

(57) ABSTRACT

A semiconductor device in which a defect is suppressed and miniaturization is achieved is provided. An insulating film is formed over a flat surface; a first mask is formed over the insulating film; a second mask is formed by performing a slimming process on the first mask; an insulating layer is formed by performing an etching process on the insulating film using the second mask; an oxide semiconductor layer covering the insulating layer is formed; a conductive film covering the oxide semiconductor layer is formed; a surface of the conductive film is flattened by performing a polishing process on the conductive film; an etching process is performed on the conductive film, so that a conductive layer is formed and a surface of the conductive layer is lower than a surface of an uppermost part of the oxide semiconductor layer; a gate insulating film in contact with the conductive layer and the oxide semiconductor layer is formed; and a gate electrode is formed in a region which is over the gate insulating film and overlaps with the insulating layer.

44 Claims, 13 Drawing Sheets

(56) References Cited

U.S. PATENT DOCUMENTS

| | | |
|---|---|---|
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,515,299 B1 | 2/2003 | Yamazaki et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,923,722 B2 | 4/2011 | Ryu et al. |
| 8,207,025 B2 * | 6/2012 | Suzawa et al. ............... 438/151 |
| 8,314,637 B2 | 11/2012 | Kato et al. |
| 8,362,538 B2 | 1/2013 | Koyama et al. |
| 8,410,838 B2 | 4/2013 | Kato et al. |
| 8,431,449 B2 * | 4/2013 | Suzawa et al. ............... 438/151 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0062522 A1 | 4/2003 | Yamazaki et al. |
| 2003/0160235 A1 | 8/2003 | Hirai |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0265745 A1 | 12/2004 | Sho et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0049051 A1 | 3/2007 | Ahn et al. |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0196962 A1 | 8/2007 | Morisue et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001232 A1 | 1/2008 | Lee et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237875 A1 | 10/2008 | Yamazaki et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001467 A1 * | 1/2009 | Nagai et al. ............... 438/166 |
| 2009/0068773 A1 | 3/2009 | Lai et al. |
| 2009/0073325 A1 | 3/2009 | Kuwabara et al. |
| 2009/0078939 A1 | 3/2009 | Yamazaki et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0081091 A1 | 4/2010 | Hashimoto et al. |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0241261 A1 | 9/2010 | Taguchi et al. |
| 2010/0252832 A1 | 10/2010 | Asano et al. |
| 2011/0084268 A1 | 4/2011 | Yamazaki et al. |
| 2011/0089419 A1 | 4/2011 | Yamazaki et al. |
| 2011/0101351 A1 | 5/2011 | Yamazaki |
| 2011/0156028 A1 | 6/2011 | Yamazaki et al. |
| 2011/0157961 A1 | 6/2011 | Yamazaki et al. |
| 2011/0175087 A1 | 7/2011 | Yamazaki et al. |
| 2011/0193076 A1 | 8/2011 | Yun et al. |
| 2011/0210957 A1 | 9/2011 | Koyama et al. |
| 2011/0215317 A1 * | 9/2011 | Yamazaki et al. ............... 257/43 |
| 2011/0215319 A1 | 9/2011 | Yamazaki et al. |
| 2011/0215326 A1 | 9/2011 | Godo et al. |
| 2011/0230019 A1 | 9/2011 | Yun et al. |
| 2012/0061670 A1 | 3/2012 | Suzawa et al. |
| 2012/0175610 A1 | 7/2012 | Yamazaki |
| 2012/0193625 A1 | 8/2012 | Sasagawa et al. |
| 2012/0235140 A1 | 9/2012 | Suzawa et al. |
| 2013/0057315 A1 | 3/2013 | Kato et al. |

FOREIGN PATENT DOCUMENTS

| | | |
|---|---|---|
| JP | 60-198861 | 10/1985 |
| JP | 61-204976 | 9/1986 |
| JP | 61204976 A * | 9/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2009-059805 | 3/2009 |
| JP | 2010-021170 | 1/2010 |
| WO | WO-2004/114391 | 12/2004 |

OTHER PUBLICATIONS

Nakamura et al., "The Phase Relations in the $In_2O_3$—$Ga_2ZnO_4$—ZnO System at 1350° C.," J. Solid State Chem., Aug. 1, 1991, vol. 93, No. 2, pp. 298-315.

Kimizuka et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," J. Solid State Chem., Apr. 1, 1995, vol. 116, No. 1, pp. 170-178.

Nakamura, et al., "Syntheses and Crystal Structures of New Homologous Compounds, Indium Iron Zinc Oxides $(InFeO_3(ZnO)_m)$ (m: natural number) and Related Compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Kawamura et al., "Low-Voltage Operating Amorphous Oxide TFTs," IDW '09: Proceedings of the 16th International Display Workshops, Dec. 9, 2009, pp. 1689-1692.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Fortunato.E et al., "Wide-Bandgap High-Mobility Zno Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04: SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08: SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for Amoled Back Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Smposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving technology,", SID Digest '09: SID International Symposium, Digest of Technical Papers, May 31, 2009, pp. 395-398.

Lee.H et al., "Current Status of, Challenges to, and Perspective View of AM-OLED,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue phases for Display Application,", SID Digest '07: SID International Symposium Digest of Technical Papers, 2007, vol. 38, pp. 1737-1740.

Nakamura.M, "Symthesis of Homologous Compund with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN, J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings Of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

FIG. 8A1
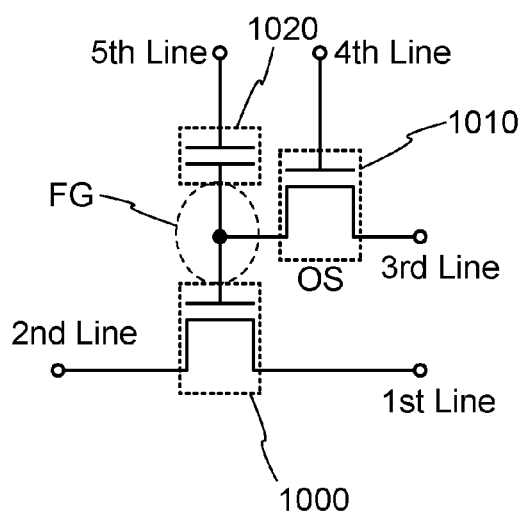
FIG. 8B
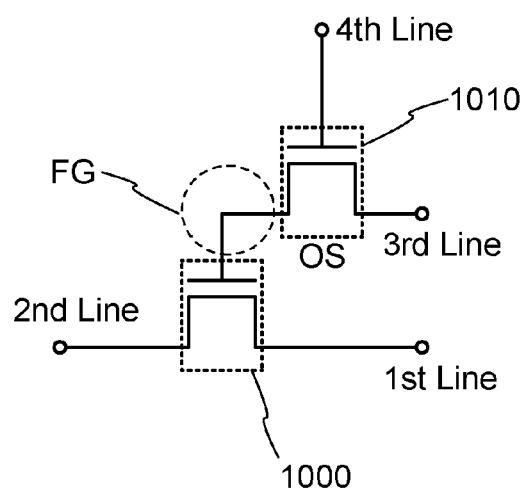
FIG. 8A2
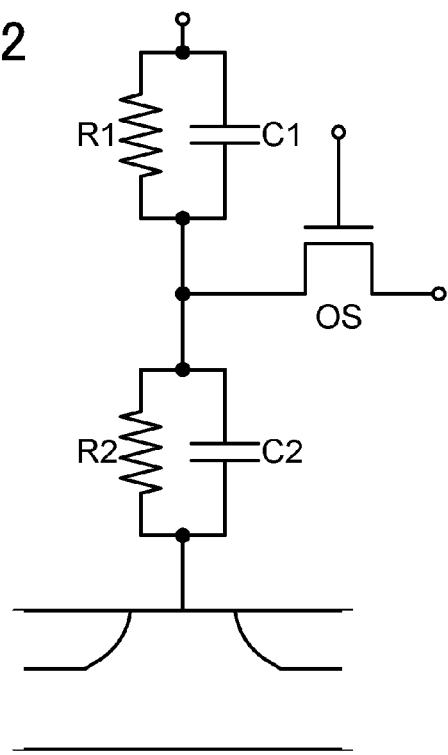

terminal A

MANUFACTURING METHOD OF SEMICONDUCTOR DEVICE

BACKGROUND OF THE INVENTION

1. Field of the Invention

The technical field of the present invention relates to a manufacturing method of a semiconductor device. Here, semiconductor devices refer to general elements and devices which function utilizing semiconductor characteristics.

2. Description of the Related Art

There are a wide variety of metal oxides and such metal oxides are used for various applications. Indium oxide is a well-known material and has been used for transparent electrodes required in liquid crystal display devices or the like.

Some metal oxides have semiconductor characteristics. Examples of such metal oxides having semiconductor characteristics are tungsten oxide, tin oxide, indium oxide, zinc oxide, and the like. Thin film transistors in which a channel formation region is formed using such metal oxides are already known (e.g., see Patent Documents 1 to 4, Non-Patent Document 1, and the like).

As metal oxides, not only single-component oxides but also multi-component oxides are known. For example, $InGaO_3(ZnO)_m$ (m: natural number) having a homologous phase is known as a multi-component oxide semiconductor containing In, Ga, and Zn (e.g., see Non-Patent Documents 2 to 4 and the like).

Furthermore, it has been proved that an oxide semiconductor containing such an In—Ga—Zn-based oxide is applicable to a channel formation region of a thin film transistor (e.g., see Patent Document 5, Non-Patent Documents 5 and 6, and the like).

In order to achieve high speed operation of a transistor or the like, miniaturization of the transistor is needed. For example, in Patent Document 6, a thin film transistor including an oxide semiconductor used for a channel layer with a thickness of about 10 nm is disclosed. In Non-Patent Document 7, a thin film transistor including an oxide semiconductor whose channel length is 2 μm to 100 μm is disclosed.

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2010-21170

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", Appl. Phys. Lett., 17 Jun. 1996, Vol. 68, pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", J. Solid State Chem., 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", KOTAI BUTSURI (SOLID STATE PHYSICS), 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492

[Non-Patent Document 7] T. Kawamura, H. Uchiyama, S. Saito, H. Wakana, T. Mine, and M. Hatano, "Low-Voltage Operating Amorphous Oxide TFTs", IDW'09, pp. 1689-1692

SUMMARY OF THE INVENTION

In order to make use of characteristics of an oxide semiconductor such as a light-transmitting property or an advantage that an oxide semiconductor film with a large area of more than or equal to 1 m×1 m can be easily formed, a glass substrate or the like is used as a substrate over which a transistor including an oxide semiconductor is formed. However, the step height of a surface of the glass substrate is about several tens of micrometers at a maximum, which is large as compared to the case of a silicon wafer or the like. Therefore, the accuracy of photomask projection exposure in semiconductor processing in the case of using a glass substrate is lower than that in the case of using a silicon wafer or the like, and the actual minimum feature size in the case of using a glass substrate is several micrometers at minimum.

In the case of using an exposure apparatus for glass substrates (also referred to as a stepper), the above-described limit of the feature size makes it difficult to achieve sufficient miniaturization at submicron level. However, in order to fully utilize characteristics of an oxide semiconductor or an advantage attributed to the characteristics (e.g., an advantage of easily realizing large size), miniaturization is critical even under such a difficult situation.

In the case where a transistor is miniaturized, a problem of a short channel effect arises. The short channel effect refers to degradation of electrical characteristics which becomes obvious along with miniaturization of a transistor (a reduction in channel length (L)). The short channel effect results from the effect of an electric field of a drain on a source. Specific examples of the short channel effect are a decrease in threshold voltage, an increase in S value (subthreshold swing), an increase in leakage current, and the like. The short channel effect is likely to occur particularly in a transistor including an oxide semiconductor because the threshold voltage of such a transistor cannot be controlled by doping, unlike a transistor including silicon.

In view of these problems, it is an object of one embodiment of the invention disclosed herein to provide a semiconductor device which suppresses a defect and achieves miniaturization. Further, it is another object of one embodiment of the invention disclosed herein to provide a semiconductor device which achieves miniaturization with favorable characteristics maintained.

One embodiment of the invention disclosed herein is a manufacturing method of a semiconductor device including the following steps: a step of forming an insulating film over a flat surface; a step of forming a first mask over the insulating film; a step of performing a slimming process on the first mask, so that a second mask is formed; a step of performing an etching process on the insulating film using the second mask, so that an insulating layer is formed; a step of forming an oxide semiconductor layer covering the insulating layer; a step of forming a conductive film covering the oxide semiconductor layer; a step of performing a polishing process on the conductive film, so that a surface of the conductive film is flattened; a step of performing an etching process on the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming an insulating film over a flat surface; a step of forming a first mask over the insulating film; a step of performing a slimming process on the first mask, so that a second mask is formed; a step of performing an etching process on the insulating film using the second mask, so that an insulating layer is formed; a step of etching a corner of the insulating layer, so that the corner is rounded; a step of forming an oxide semiconductor layer covering the insulating layer; a step of forming a conductive film covering the oxide semiconductor layer; a step of performing a polishing process on the conductive film, so that a surface of the conductive film is flattened; a step of performing an etching process on the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming a first transistor including a channel formation region, a first gate insulating film over the channel formation region, a first gate electrode which overlaps with the channel formation region and is over the first gate insulating film, and a first source electrode and a first drain electrode electrically connected to the channel formation region; a step of forming an interlayer insulating film covering the first transistor and having a flat surface; a step of forming an insulating film over the interlayer insulating film; a step of forming a first mask over the insulating film; a step of performing a slimming process on the first mask, so that a second mask is formed; a step of performing an etching process on the insulating film using the second mask, so that an insulating layer is formed; a step of forming an oxide semiconductor layer covering the insulating layer; a step of forming a conductive film covering the oxide semiconductor layer; a step of performing a polishing process on the conductive film, so that a surface of the conductive film is flattened; a step of performing an etching process on the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming a first transistor including a channel formation region, a first gate insulating film over the channel formation region, a first gate electrode which overlaps with the channel formation region and is over the first gate insulating film, and a first source electrode and a first drain electrode electrically connected to the channel formation region; a step of forming an interlayer insulating film covering the first transistor and having a flat surface; a step of forming an insulating film over the interlayer insulating film; a step of forming a first mask over the insulating film; a step of performing a slimming process on the first mask, so that a second mask is formed; a step of performing an etching process on the insulating film using the second mask, so that an insulating layer is formed; a step of etching a corner of the insulating layer, so that the corner is rounded; a step of forming an oxide semiconductor layer covering the insulating layer; a step of forming a conductive film covering the oxide semiconductor layer; a step of performing a polishing process on the conductive film, so that a surface of the conductive film is flattened; a step of performing an etching process on the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming an insulating film over a flat surface; a step of forming a first mask over the insulating film; a step of performing a slimming process on the first mask, so that a second mask is formed; a step of performing an etching process on the insulating film using the second mask, so that an insulating layer is formed; a step of forming an oxide semiconductor layer covering the insulating layer; a step of forming a conductive film covering the oxide semiconductor layer; a step of forming a planarizing film over the conductive film; a step of performing an etching process on the planarizing film and the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming an insulating film over a flat surface; a step of forming a first mask over the insulating film; a step of performing a slimming process on the first mask, so that a second mask is formed; a step of performing an etching process on the insulating film using the second mask, so that an insulating layer is formed; a step of etching a corner of the insulating layer, so that the corner is rounded; a step of forming an oxide semiconductor layer covering the insulating layer; a step of forming a conductive film covering the oxide semiconductor layer; a step of forming a planarizing film over the conductive film; a step of performing an etching process on the planarizing film and the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming a first transistor including a channel formation region, a first gate insulating film over the channel formation region, a first gate electrode which overlaps with the channel formation region and is over the first gate insulating film, and a first source electrode and a first drain electrode electrically connected to the channel formation region; a step of forming an interlayer insulating film covering the first transistor and having a flat surface; a step of forming an insulating film over the interlayer insulating film; a step of forming a first mask over the insulating film; a step of performing a slimming process on the first mask, so that a second mask is formed; a step of performing an etching process on the insulating film using the second mask, so that an insulating layer is formed; a step of forming an oxide semiconductor layer covering the insulating layer; a step of forming a conductive film covering the oxide semiconductor layer; a step of forming a planarizing film over the conductive film; a step of performing an etching process on the planarizing film and the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Another embodiment of the invention disclosed herein is a manufacturing method of a semiconductor device including the following steps: a step of forming a first transistor including a channel formation region, a first gate insulating film over the channel formation region, a first gate electrode which overlaps with the channel formation region and is over the first gate insulating film, and a first source electrode and a first drain electrode electrically connected to the channel formation region; a step of forming an interlayer insulating film covering the first transistor and having a flat surface; a step of forming an insulating film over the interlayer insulating film; a step of forming a first mask over the insulating film; a step of performing a slimming process on the first mask, so that a second mask is formed; a step of performing an etching process on the insulating film using the second mask, so that an insulating layer is formed; a step of etching a corner of the insulating layer, so that the corner is rounded; a step of forming an oxide semiconductor layer covering the insulating layer; a step of forming a conductive film covering the oxide semiconductor layer; a step of forming a planarizing film over the conductive film; a step of performing an etching process on the planarizing film and the conductive film, so that a conductive layer is formed and a surface of the conductive layer is lower than a surface of an uppermost part of the oxide semiconductor layer; a step of forming a gate insulating film in contact with the conductive layer and the oxide semiconductor layer; and a step of forming a gate electrode in a region which is over the gate insulating film and overlaps with the insulating layer. Note that there is a case in which a step height formed by the surface of the uppermost part of the oxide semiconductor layer and the surface of the conductive layer is more than or equal to 5 nm and less than or equal to 20 nm.

Further, in the above manufacturing method of the semiconductor device, there is a case in which the flat surface has a root-mean-square roughness of 1 nm or less. Further, there is a case in which the slimming process is an ashing process using an oxygen radical. Further, there is a case in which the polishing process is performed by chemical mechanical polishing. Furthermore, there is a case in which the insulating film is formed by sputtering.

Note that in this specification and the like, the root-mean-square (RMS) roughness is obtained by three-dimensionally expanding the RMS roughness of a cross section curve so that the RMS roughness of a cross section curve can be applied to the measurement surface. The RMS roughness is represented by the square root of the mean value of the square of the deviation from the reference surface to the specific surface, and is obtained by the following formula.

$$R_{ms} = \sqrt{\frac{1}{S_0} \int_{Y_1}^{Y_2} \int_{X_1}^{X_2} \{F(X, Y) - Z_0\}^2 \, dX \, dY} \qquad \text{[Formula 1]}$$

Note that the measurement surface is a surface which is shown by all the measurement data, and is represented by the following formula.

$$Z = F(X, Y) \qquad \text{[Formula 2]}$$

The specific surface is a surface which is a target of roughness measurement, and is a rectangular region which is surrounded by four points represented by the coordinates $(X_1, Y_1)$, $(X_1, Y_2)$, $(X_2, Y_1)$, and $(X_2, Y_2)$. The area of the specific surface when the specific surface is flat ideally is denoted by $S_0$. Note that $S_0$ can be obtained by the following formula.

$$S_0 = |X_2 - X_1| \cdot |Y_2 - Y_1| \qquad \text{[Formula 3]}$$

In addition, the reference surface refers to a surface parallel to an X-Y surface at the average height of the specific surface. In short, when the average value of the height of the specific surface is denoted by $Z_0$, the height of the reference surface is also denoted by $Z_0$. Note that $Z_0$ can be obtained by the following formula.

$$Z_0 = \frac{1}{S_0} \int_{Y_1}^{Y_2} \int_{X_1}^{X_2} F(X, Y) dX dY \quad \text{[Formula 4]}$$

Note that in this specification and the like, the root-mean-square (RMS) roughness is calculated in a region of 10 nm×10 nm, preferably 100 nm×100 nm, further preferably 1 µm×1 µm from an AFM image obtained using an atomic force microscope (AFM).

The channel length L of the above-described transistor is preferably more than or equal to 30 nm and less than 2000 nm (2 µm), further preferably more than or equal to 50 nm and less than or equal to 350 nm, and still further preferably more than or equal to 100 nm and less than or equal to 150 nm. The thickness of the oxide semiconductor layer is preferably more than or equal to 1 nm and less than or equal to 100 nm, further preferably more than or equal to 2 nm and less than or equal to 50 nm, and still further preferably more than or equal to 3 nm and less than or equal to 30 nm. This can realize a semiconductor device which operates at high speed and consumes low power. In addition, the gate insulating film is preferably formed using a high dielectric constant material such as hafnium oxide. Hafnium oxide has a relative permittivity of about 15, which is much higher than that of silicon oxide which is 3 to 4. Such a material facilitates miniaturization of a semiconductor device. Furthermore, a purified and intrinsic oxide semiconductor is used for the oxide semiconductor layer. This enables the carrier density of the oxide semiconductor layer to be lower than $1\times10^{12}/\text{cm}^3$, preferably lower than $1.45\times10^{10}/\text{cm}^3$, and the off-state current of the transistor to be 100 zA/µm or less (1 zA (zeptoampere) is $1\times10^{-21}$ A), preferably 10 zA/µm or less, for example. The lowest off-state current per unit channel width (1 µm) is $10^{-30}$ A. That is, the value of the off-state current is $10^{-30}$ (A/µm) or more (that is, more than or equal to $1\times10^{-30}$ A/µm and less than or equal to $10^{-21}$ A/µm). The gate electrode may overlap with the source electrode and the drain electrode, or only an end portion and another end portion of the gate electrode may correspond to an end portion of a source electrode and an end portion of a drain electrode, respectively. Here, the expression "to correspond" means "to overlap in the plane layout".

In this specification, the semiconductor device indicates all the devices that can operate by utilizing semiconductor characteristics. For example, a display device, a memory device, an integrated circuit, and the like are included in the category of the semiconductor device.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode. Moreover, the terms such as "over" and "below" are used simply for convenience of explanation.

In addition, in this specification and the like, the term such as an "electrode" or a "wiring" does not limit the function of the component. For example, an "electrode" can be used as part of a "wiring", and vice versa. Further, the term "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

In an embodiment of the invention disclosed herein, the transistor can be sufficiently miniaturized regardless of the kind of substrate. Therefore, it is possible to provide a semiconductor device which fully utilizes characteristics of an oxide semiconductor or an advantage attributed to the characteristics (e.g., an advantage of easily realizing large size).

An embodiment of the invention disclosed herein can solve a problem which may be caused along with the miniaturization. As a result, it becomes possible to reduce the size of a transistor with favorable characteristics maintained.

By sufficiently reducing the size of the transistor, the area of a semiconductor device including the transistor is reduced, and the number of semiconductor devices obtained from one substrate is increased. Accordingly, the manufacturing cost per semiconductor device is reduced. Further, since the size of a semiconductor device is reduced, a semiconductor device having higher function than a conventional semiconductor device in almost the same size can be realized. Moreover, advantageous effects such as high-speed operation and lower power consumption due to a reduction in channel length can be obtained. In other words, according to one embodiment of the invention disclosed herein, miniaturization of a transistor including an oxide semiconductor is achieved, and therefore a variety of advantageous effects accompanying the miniaturization can be obtained.

As described above, according to one embodiment of the disclosed invention, a semiconductor device which suppresses defects or maintains favorable characteristics, and achieves miniaturization can be provided.

BRIEF DESCRIPTION OF THE DRAWINGS

In the accompanying drawings:

FIGS. 8A1, 8A2, and 8B show application examples of a semiconductor device;

DETAILED DESCRIPTION OF THE INVENTION

Figure 1A:
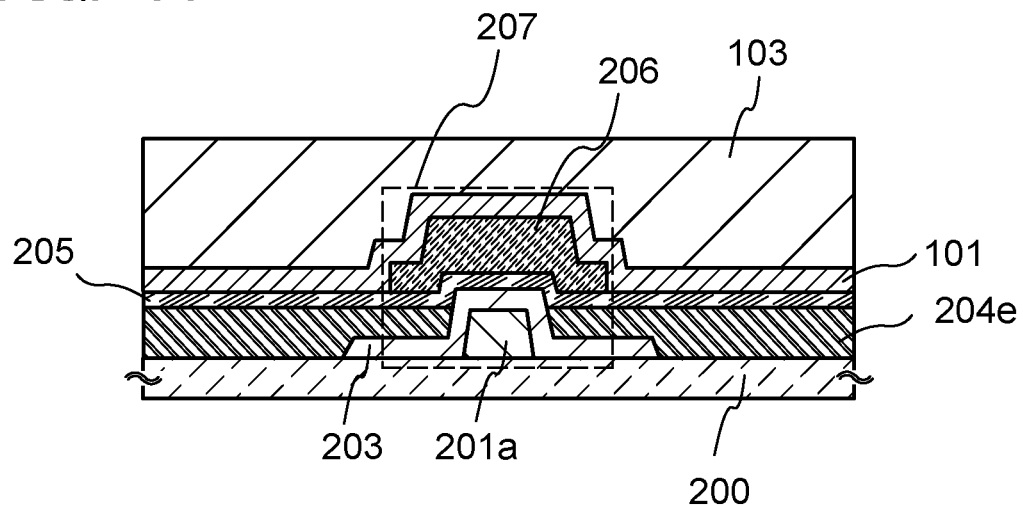
FIGS. 1A and 1B are cross-sectional views each illustrating a structure example of a semiconductor device.

Hereinafter, embodiments of the present invention will be described with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description of the following embodiments.

Note that the position, the size, the range, or the like of each structure illustrated in drawings and the like is not accurately represented in some cases for easy understanding. Therefore, the invention disclosed herein is not necessarily limited to such position, size, range, and the like disclosed in the drawings and the like.

In this specification and the like, ordinal numbers such as "first", "second", and "third" are used in order to avoid confusion between components, and the terms do not limit the components numerically.

Embodiment 1

In this embodiment, a structure and a manufacturing method of a semiconductor device according to an embodiment of the invention disclosed herein will be described with reference to FIGS. 1A and 1B, and FIGS. 2A to 2E, FIGS. 3A to 3D, and FIGS. 4A to 4E.

Structure Example of Semiconductor Device

Figure 1B:
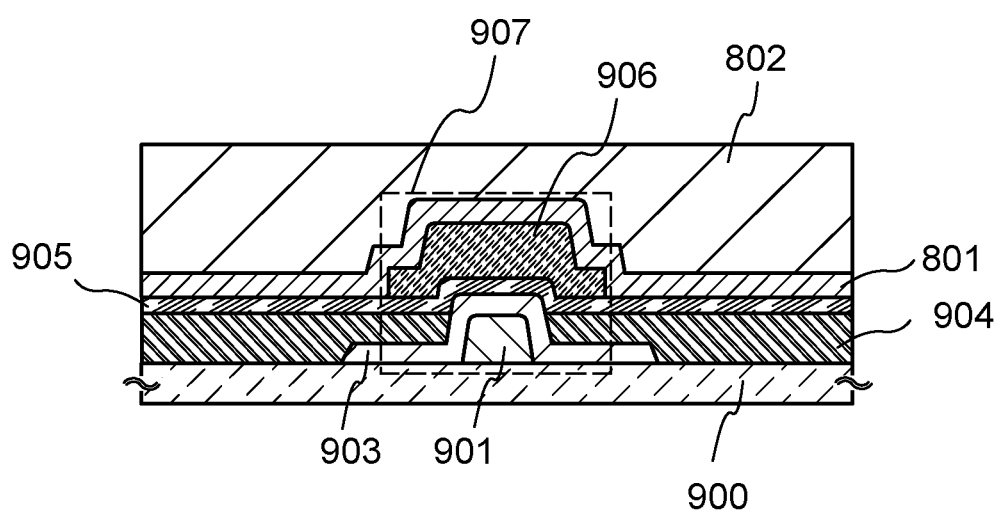

FIGS. 1A and 1B illustrate structure examples of a semiconductor device. FIG. 1A illustrates a first structure example, and FIG. 1B illustrates a second structure example.

A transistor 207 illustrated in FIG. 1A includes an insulating layer 201a over a substrate 200 having an insulating surface, an oxide semiconductor layer 203 covering the insulating layer 201a, a conductive layer 204e functioning as a source electrode or a drain electrode, an insulating film 205 functioning as a gate insulating film, and a conductive layer 206 functioning as a gate electrode. The conductive layer 204e is in contact with a part of the oxide semiconductor layer 203 and a part of the substrate 200 and is divided with the insulating layer 201a serving as a boundary. Further, there are some cases in which the transistor 207 includes an insulating film 101 and an insulating film 103.

By using an oxide semiconductor in an active layer of the transistor as illustrated in FIG. 1A, favorable characteristics can be obtained.

Here, the surface of the substrate 200 over which components are formed and a region in contact with the oxide semiconductor layer 203 in a part of a surface of the insulating layer 201a (in particular, a region parallel to the surface over which components are formed) preferably have a root-mean-square (RMS) roughness of 1 nm or less (further preferably 0.5 nm or less). The thickness of the insulating layer 201a is preferably more than or equal to 5 nm and less than or equal to 20 nm.

As described above, a part of the oxide semiconductor layer 203 is provided over a highly flat region having a root-mean-square (RMS) roughness of 1 nm or less. This makes it possible to control a problem such as a short channel effect even under a situation where the transistor 207 is miniaturized; accordingly, the transistor 207 having favorable characteristics can be provided.

The increase in flatness of the surface over which components are formed can make the thickness distribution of the oxide semiconductor layer 203 uniform; therefore, characteristics of the transistor 207 can be improved. In addition, a decrease in coverage which may be caused by an extremely large step height can be suppressed, and a disconnection or a defective connection of the oxide semiconductor layer 203 can be prevented.

By a small step height (e.g., a step height of more than or equal to 5 nm and less than or equal to 20 nm) which is formed by the insulating layer 201a as described above, the path of electric current is extended, and the resistance of the path of electric current is increased because the contact area between the oxide semiconductor layer 203 and the conductive layer 204e is decreased. This makes it possible to alleviate the concentration of an electric field in the transistor 207 and to further suppress a short channel effect.

Here, the oxide semiconductor layer 203 is preferably an oxide semiconductor layer which is purified by sufficiently removing an impurity such as hydrogen therefrom or by sufficiently supplying oxygen thereto. Specifically, the hydrogen concentration of the oxide semiconductor layer 203 is $5\times10^{19}$ atoms/cm$^3$ or lower, preferably $5\times10^{18}$ atoms/cm$^3$ or lower, further preferably $5\times10^{17}$ atoms/cm$^3$ or lower, for example. Note that the above hydrogen concentration of the oxide semiconductor layer 203 is measured by secondary ion mass spectrometry (SIMS). In the oxide semiconductor layer 203 in which hydrogen is reduced to a sufficiently low concentration so that the oxide semiconductor layer is purified and in which a defect level in an energy gap induced by oxygen deficiency is reduced by sufficiently supplying oxygen as described above, the concentration of carriers induced by a donor such as hydrogen is lower than $1\times10^{12}$/cm$^3$, preferably lower than $1\times10^{11}$/cm$^3$, and further preferably lower than $1.45\times10^{10}$/cm$^3$. In addition, for example, the off-state current (per unit channel width (1 μm), here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor, the transistor 207 which has extremely favorable off-state current characteristics can be obtained. The oxide semiconductor may be in an amorphous state, a microcrystalline state, a polycrystalline state, or the like. The c-axes of the oxide semiconductor in a polycrystalline state or a microcrystalline state may be uniformly aligned perpendicularly to the substrate.

Note that the lowest off-state current per unit channel width (1 μm) is $10^{-30}$ A in theory. That is, it can be said that the value of the off-state current is at least $10^{-30}$ (A/μm).

A transistor 907 illustrated in FIG. 1B has a similar structure to the transistor 207 and includes an insulating layer 901 over a substrate 900 having an insulating surface, an oxide semiconductor layer 903 covering the insulating layer 901, a conductive layer 904 functioning as a source electrode or a drain electrode, an insulating film 905 functioning as a gate insulating film, and a conductive layer 906 functioning as a gate electrode. The conductive layer 904 is in contact with a part of the oxide semiconductor layer 903 and a part of the substrate 900 and is divided with the insulating layer 901 serving as a boundary. Further, there are some cases in which the transistor 907 includes an insulating film 801 and an insulating film 802.

By using an oxide semiconductor in an active layer of the transistor as illustrated in FIG. 1B, favorable characteristics can be obtained.

Here, the surface of the substrate 900 over which components are formed and a region in contact with the oxide semiconductor layer 903 in a part of a surface of the insulating layer 901 (in particular, a region parallel to the surface over which components are formed) preferably have a root-mean-square (RMS) roughness of 1 nm or less (further preferably 0.5 nm or less). The thickness of the insulating layer 901 is preferably more than or equal to 5 nm and less than or equal to 20 nm.

As described above, a part of the oxide semiconductor layer 903 is provided over a highly flat region having a root-mean-square (RMS) roughness of 1 nm or less. This makes it possible to control a problem such as a short channel effect even under a situation where the transistor 907 is miniaturized; accordingly, the transistor 907 having favorable characteristics can be provided.

One difference between the transistor 907 in FIG. 1B and the transistor 207 in FIG. 1A is whether a corner of the insulating layer (that is, the insulating layer 201a or the insulating layer 901) existing below the channel formation region of the transistor is removed. That is, a corner of the insulating layer 201a remains sharp in the transistor 207 in FIG. 1A, whereas a corner of the insulating layer 901 is rounded in the transistor 907 in FIG. 1B. For formation of an insulating layer with a rounded corner as the insulating layer existing below the channel formation region, for example, an etching process may be performed on the insulating layer.

The effects resulting from the structure in FIG. 1B are similar to those from the structure in FIG. 1A. In other words, because a channel formation region of the transistor 907 is provided over a highly flat region, a problem such as a short channel effect can be controlled even under a situation where the transistor 907 is miniaturized; accordingly, the transistor 907 having favorable characteristics can be provided. The increase in flatness of the surface over which components are formed can make the thickness distribution of the oxide semiconductor layer 903 uniform; therefore, characteristics of the transistor 907 can be improved. Further, a decrease in coverage which may be caused by an extremely large step height can be suppressed, and a disconnection or a defective connection of the oxide semiconductor layer 903 can be prevented. Moreover, by making a small step height which is formed by the insulating layer 901 as described above, a high-resistance region is provided in a part of the oxide semiconductor layer 903; accordingly, the concentration of an electric field in the transistor 907 can be alleviated, and a short channel effect can be suppressed.

Furthermore, since the corner of the insulating layer 901 is removed in the transistor 907, a disconnection or a defective connection of the oxide semiconductor layer 903 can be prevented and, in addition, the concentration of an electric field can be further alleviated.

Example of Manufacturing Method of Semiconductor Device

Next, an example of a manufacturing method of the semiconductor device will be described with reference to FIGS. 2A to 2E and FIGS. 3A to 3D. Here, FIGS. 2A to 2E and FIGS. 3A to 3D illustrate an example of a manufacturing method of the transistor 207 illustrated in FIG. 1A.

Figure 2A:
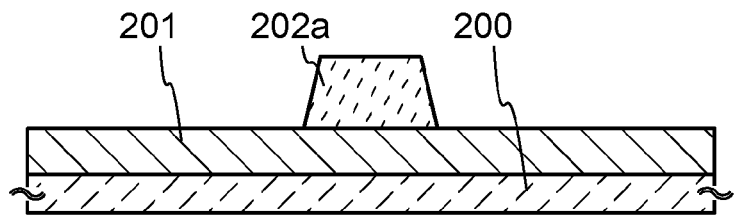
FIGS. 2A to 2E are cross-sectional views illustrating an example of a manufacturing process of the semiconductor device.

First, an insulating film 201 and a mask 202a are formed over the substrate 200 having an insulating surface (see FIG. 2A).

Although there is no particular limitation on a substrate which can be used as the substrate 200, it is necessary that the substrate 200 has at least heat resistance high enough to withstand heat treatment to be performed later. For example, the substrate may be a glass substrate, a ceramic substrate, a quartz substrate, a sapphire substrate, or the like. Alternatively, the substrate may be a single crystal semiconductor substrate or a polycrystalline semiconductor substrate of silicon, silicon carbide, or the like, a compound semiconductor substrate of silicon germanium or the like, an SOI substrate, or the like as long as the substrate has an insulating surface. Still alternatively, the substrate may be any of these substrates over which a semiconductor element is provided. Further, a base film may be provided over the substrate 200.

Note that the surface over which components are formed of the substrate 200 is preferably a sufficiently flat surface. For example, the surface over which components are formed of the substrate 200 may have a root-mean-square (RMS) roughness of 1 nm or less (preferably 0.5 nm or less). When the transistor 207 is formed over such a surface, the characteristics can be sufficiently improved. In the case where the surface over which components are formed of the substrate 200 has poor flatness, it is desirable that the surface be subjected to a chemical mechanical polishing (CMP) process, an etching process, or the like so as to have a root-mean-square (RMS) roughness within the above range. Note that, for the details of the CMP process, later description can be referred to.

The insulating film 201 can be formed using a material containing an inorganic insulating material such as silicon oxide, silicon oxynitride, silicon nitride, aluminum oxide, or gallium oxide. The oxide semiconductor layer 203 formed later is in contact with the insulating film 201. Although there is no particular limitation on the formation method of the insulating film 201, in consideration of contact with the oxide semiconductor layer 203, a method in which hydrogen is sufficiently reduced is preferably employed. As an example of such a method, a sputtering method and the like can be given. Needless to say, another deposition method such as a plasma CVD method may be used.

Note that the surface of the insulating film 201 is preferably a sufficiently flat surface. For example, the surface may have a root-mean-square (RMS) roughness of 1 nm or less (preferably 0.5 nm or less). When the oxide semiconductor layer 203 is formed over such a surface, the characteristics can be sufficiently improved. In the case where the surface of the insulating film 201 has poor flatness, it is desirable that the surface be subjected to a chemical mechanical polishing (CMP) process, an etching process, or the like so as to have a root-mean-square (RMS) roughness within the above range. Note that, for the details of the CMP process, later description can be referred to.

The mask 202a can be formed by a photolithography technique using a material such as a photoresist.

As long as it is possible to form a mask having a sufficiently fine pattern, a different method such as an ink-jet method may be used to form the mask 202a. In this case, it is unnecessary to use a photosensitive material such as a photoresist as a material of the mask 202a.

Figure 2B:
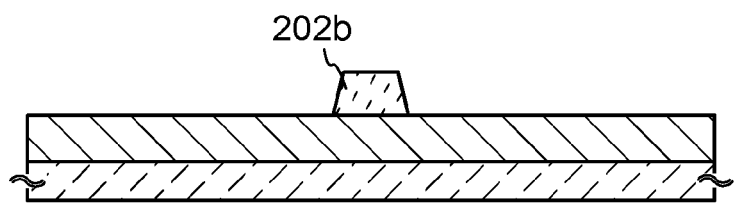

Next, a slimming process is performed on the mask 202a, so that a mask 202b having a finer pattern is formed (see FIG. 2B).

As the slimming process, an ashing process in which oxygen in a radical state (an oxygen radical) or the like is used can be employed, for example. However, the slimming process is not limited to the above ashing process as long as the mask 202a can be processed into a finer pattern. Note that the channel length (L) of a transistor is determined by the formed mask 202b. Therefore, it is preferable to employ a process with high controllability as the slimming process.

As a result of the slimming process, the line width of the mask 202b can be reduced to a length of less than or equal to half of the resolution limit of a light exposure apparatus, preferably less than or equal to one third of the resolution limit of the light exposure apparatus. For example, the line width can become more than or equal to 30 nm and less than or equal to 2000 nm (2 μm), preferably more than or equal to 50 nm and less than or equal to 350 nm. This enables further miniaturization of the transistor.

Figure 2C:
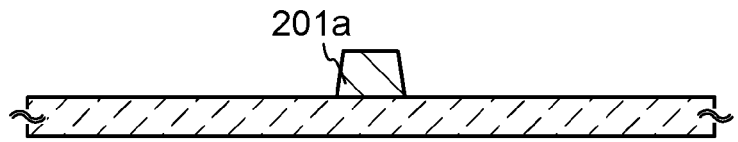

Next, the insulating film 201 is processed with the use of the mask 202b, so that the insulating layer 201a is formed (see FIG. 2C).

The processing of the insulating film 201 into the insulating layer 201a can be performed using an etching process, for example. Although either a dry etching process or a wet etching process may be performed as the etching process, dry etching with high controllability is preferably used for miniaturization. The etching process may be performed so that the insulating layer 201a has a tapered shape. The taper angle can be, for example, more than or equal to 30° and less than or equal to 60°.

The channel length (L) of the transistor 207 is determined by the insulating layer 201a formed in the above-described manner. Since the size of the insulating layer 201a is substantially the same as that of the mask 202b, the channel length (L) of the transistor is more than or equal to 30 nm and less than or equal to 2000 nm (2 μm), preferably more than or equal to 50 nm and less than or equal to 350 nm.

Figure 2D:
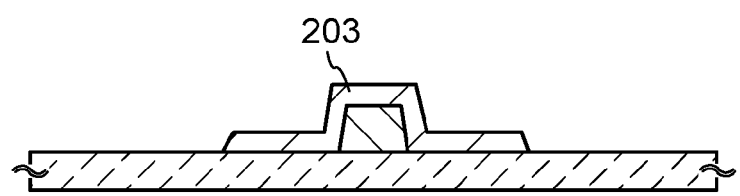

Next, the oxide semiconductor layer 203 is formed so as to cover the insulating layer 201a (see FIG. 2D).

The oxide semiconductor layer 203 can be formed using a four-component metal oxide such as an In—Sn—Ga—Zn-based oxide semiconductor, a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor, a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, or an In—Mg-based oxide semiconductor, an In-based oxide semiconductor, a Sn-based oxide semiconductor, a Zn-based oxide semiconductor, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn-based oxide semiconductor which has an atomic ratio of In:Zn:O=X:Y:Z, the relation of Z>1.5X+Y is satisfied.

An In—Ga—Zn-based oxide semiconductor material has sufficiently high resistance when there is no electric field and thus off-state current can be sufficiently reduced. In addition, also having high field-effect mobility, the In—Ga—Zn-based oxide semiconductor material is suitable as a semiconductor material used in a semiconductor device. An In—Ga—Zn-based oxide semiconductor means an oxide semiconductor containing indium (In), gallium (Ga), and zinc (Zn), and there is no limitation on the composition ratio thereof.

As a typical example of the In—Ga—Zn-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have, and are mere examples.

As a target for forming the oxide semiconductor layer 203 using a sputtering method, a target having a composition ratio of In:Ga:Zn=1:x:y (x is 0 or more and y is more than or equal to 0.5 and less than or equal to 5) is preferably used. For example, a target having a composition ratio of In:Ga:Zn=1:1:1 [atomic ratio] (x=1, y=1) (i.e., $In_2O_3$:$Ga_2O_3$:ZnO=1:1:2 [molar ratio]) or the like can be used. Alternatively, the following targets can be also used: a target having a composition ratio of In:Ga:Zn=1:1:0.5 [atomic ratio] (x=1, y=0.5); a target having a composition ratio of In:Ga:Zn=1:1:2 [atomic ratio] (x=1, y=2); or a target having a composition ratio of In:Ga:Zn=1:0:1 [atomic ratio] (x=0, y=1).

In this embodiment, the oxide semiconductor layer 203 having an amorphous structure is formed by a sputtering method with the use of an In—Ga—Zn-based metal oxide target. The thickness is more than or equal to 1 nm and less than or equal to 100 nm, preferably more than or equal to 2 nm and less than or equal to 50 nm, further preferably more than or equal to 3 nm and less than or equal to 30 nm.

The relative density of the metal oxide in the metal oxide target is 80% or higher, preferably 95% or higher, and further preferably 99.9% or more. The use of the metal oxide target having high relative density makes it possible to form an oxide semiconductor layer having a dense structure.

The atmosphere in which the oxide semiconductor layer 203 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, a concentration of 10 ppb or less).

In forming the oxide semiconductor layer 203, for example, an object to be processed is held in a treatment chamber that is maintained in reduced pressure, and the object is heated to a temperature of higher than or equal to 100° C. and lower than 550° C., preferably higher than or equal to 200° C. and lower than or equal to 400° C. Alternatively, the temperature of an object to be processed in forming the oxide semiconductor layer 203 may be room temperature (higher than or equal to 15° C. and lower than or equal to 35° C.). Then, moisture in the treatment chamber is removed, a sputtering gas from which hydrogen, water, or the like has been removed is introduced, and the above-described target is used; thus, the oxide semiconductor layer 203 is formed. By forming the oxide semiconductor layer 203 while heating the object, an impurity in the oxide semiconductor layer 203 can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbo pump provided with a cold trap may be used. Since it is possible to remove hydrogen, water, or the like from the treatment chamber by evacuating the treatment chamber with a cryopump or the like, the concentration of an impurity in the oxide semiconductor layer can be reduced.

For example, the oxide semiconductor layer 203 can be formed under the following conditions: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power supply is preferably used because particles can be reduced and the film thickness can be made uniform. The thickness of the oxide semiconductor layer 203 is set more than or equal to 1 nm and less than or equal to 100 nm, preferably more than or equal to 2 nm and less than or equal to 50 nm, further preferably more than or equal to 3 nm and less than or equal to 30 nm. By employing a structure according to the invention disclosed herein, a short channel effect due to miniaturization can be suppressed even in the case of using the oxide semiconductor layer 203 having such a thickness. Note that the appropriate thickness of the oxide semiconductor layer differs depending on the oxide semiconductor material used, the intended use of the semiconductor device, or the like; therefore, the thickness can be determined as appropriate in accordance with the material, the intended use, or the like. Note that a surface over which the oxide semiconductor layer 203 is formed is sufficiently flattened in one embodiment of the invention disclosed herein. Therefore, even the oxide semiconductor layer 203 having a small thickness can be favorably formed.

Note that before the oxide semiconductor layer 203 is formed by a sputtering method, reverse sputtering in which an argon gas is introduced and plasma is generated may be performed so that a material attached to a surface over which the oxide semiconductor layer 203 is to be formed (e.g., the surface of the insulating layer 201a or the surface of the substrate 200) is removed. Here, the reverse sputtering is a method in which ions collide with a surface so that the surface is modified, in contrast to normal sputtering in which ions collide with a sputtering target. An example of a method for making ions collide with a surface is a method in which high-frequency voltage is applied to the surface side in an argon atmosphere so that plasma is generated near the object. Note that an atmosphere of nitrogen, helium, oxygen, or the like may be used instead of an argon atmosphere.

After the oxide semiconductor layer 203 is formed, heat treatment (first heat treatment) is preferably performed on the oxide semiconductor layer 203. Through the first heat treatment, excessive hydrogen (including water or a hydroxyl group) in the oxide semiconductor layer 203 can be removed, the structure of the oxide semiconductor layer 203 can be ordered, and a defect level in an energy gap can be reduced. For example, the temperature of the first heat treatment is set higher than or equal to 300° C. and lower than 550° C., or higher than or equal to 400° C. and lower than or equal to 500° C.

For example, after an object to be processed is introduced into an electric furnace including a resistance heater or the like, heat treatment can be performed at 450° C. for one hour in a nitrogen atmosphere. The oxide semiconductor layer is not exposed to the air during the heat treatment so that entry of water or hydrogen can be prevented.

The heat treatment apparatus is not limited to the electric furnace and may be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for performing heat treatment using a high-temperature gas. As the gas, an inert gas that does not react with an object by heat treatment, for example, nitrogen or a rare gas such as argon, is used.

For example, as the first heat treatment, a GRTA process may be performed as follows. The object to be processed is put in a heated inert gas atmosphere, heated for several minutes, and taken out of the inert gas atmosphere. The GRTA process enables high-temperature heat treatment in a short time. Moreover, the GRTA process can be employed even when the temperature exceeds the upper temperature limit of the object. Note that the inert gas may be switched to a gas containing oxygen during the process. This is because a defect level in energy gap due to oxygen vacancy can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6N (99.9999%) or more, preferably 7N (99.99999%) or more (that is, the concentration of the impurities is 1 ppm or less, preferably 0.1 ppm or less).

In any case, impurities are reduced by the first heat treatment so that an i-type (intrinsic) or substantially i-type oxide semiconductor layer is obtained. Accordingly, a transistor having highly excellent characteristics can be realized.

The above heat treatment (the first heat treatment) can be referred to as dehydration treatment, dehydrogenation treatment, or the like because of its effect of removing hydrogen, water, or the like. The dehydration treatment or the dehydrogenation treatment can also be performed at the following timing: after the formation of the oxide semiconductor layer 203, after the formation of the gate insulating layer, after the formation of the gate electrode, or the like. Such dehydration treatment or dehydrogenation treatment may be conducted only once or plural times.

The oxide semiconductor layer 203 is formed in such a manner that, for example, an oxide semiconductor in a film shape is formed and then processed by etching to have an island shape. The etching of the oxide semiconductor layer may be performed either before the heat treatment or after the heat treatment. Although dry etching is preferred in terms of element miniaturization, wet etching may be used. An etching gas and an etchant can be selected as appropriate depending on a material to be etched.

A conductive film 204 can be formed by a PVD method such as a sputtering method, or a CVD method such as a plasma CVD method. As a material of the conductive film 204, an element selected from aluminum, chromium, tantalum, titanium, molybdenum, and tungsten, an alloy containing any of these elements as a component, or the like can be used. A material containing one of manganese, magnesium, zirconium, beryllium, neodymium, or scandium or a combination of a plurality of these elements may be used.

The conductive film 204 may have a single-layer structure or a stacked structure including two or more layers. For example, the conductive film 204 may have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like.

The conductive film 204 may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials containing silicon or silicon oxide can be used.

Note that, in terms of a later polishing process, the thickness of the conductive film 204 needs to have a larger value than a distance between the uppermost part of the oxide semiconductor layer 203 and the surface over which components are formed of the substrate 200.

Figure 3A:
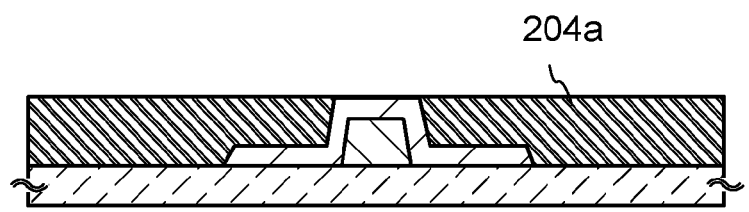
FIGS. 3A to 3D are cross-sectional views illustrating the example of the manufacturing process of the semiconductor device.

Next, a polishing process is performed on the conductive film 204, so that a conductive film 204a having substantially the same height as the uppermost part of the oxide semiconductor layer 203 is formed (see FIG. 3A). Here, it is preferable that the step height be approximately less than 5 nm.

As the polishing process, a chemical mechanical polishing (CMP) process can be employed, for example. The CMP process is a method for flattening a surface of an object with a combination of chemical and mechanical actions. More specifically, the CMP process is a method in which a polishing cloth is attached to a polishing stage, the polishing stage and an object are each rotated or swung while a slurry (an abrasive) is supplied between the object and the polishing cloth, and the surface of the object is polished by a chemical reaction between the slurry and the surface of the object and by a mechanical polishing action of the polishing cloth on the object.

Through the CMP process, the root-mean-square (RMS) roughness of a surface of the conductive film 204a can be 1 nm or less (preferably 0.5 nm or less). A part (in the uppermost part) of a surface of the oxide semiconductor layer 203 is also polished through the CMP process. Thus, the root-mean-square (RMS) roughness of the part of the surface of the oxide semiconductor layer 203 can also become 1 nm or less (preferably 0.5 nm or less).

The CMP process as the polishing process may be performed once or plural times. When the CMP process is performed in plural times, it is preferable that the first polishing step be performed at a high polishing rate and be followed by a final polishing step at a low polishing rate. By performing polishing steps with different polishing rates in combination, the flatness of the surfaces of the conductive film 204a and the oxide semiconductor layer 203 can be further increased.

As the polishing process, a process in which a CMP process and an etching process are combined may be employed as well.

By the polishing process as described above, the flatness of a surface of a channel portion of the oxide semiconductor layer 203 can be increased, and the characteristics of the transistor 207 can be improved accordingly.

Figure 3B:
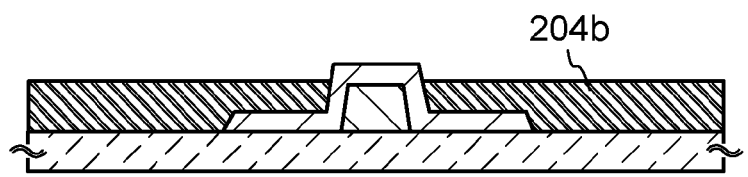

Then, a conductive layer 204b that is a source electrode or a drain electrode is formed by performing an etching process on the conductive film 204a so that a surface of the uppermost part of the oxide semiconductor layer 203 protrudes from a surface of the conductive layer 204b (see FIG. 3B).

As the etching process, either or both of a dry etching process and a wet etching process can be employed.

The step height which is formed by the conductive layer 204b and the oxide semiconductor layer 203 is preferably more than or equal to 5 nm and less than or equal to 20 nm. The path of electric current in the oxide semiconductor layer 203 is extended by the step height, and the resistance of the path of electric current is increased because the contact area between the oxide semiconductor layer 203 and the conductive layer 204e is decreased. This makes it possible to alleviate the concentration of an electric field in the transistor 207 and to suppress a short channel effect.

Note that after the above-described etching process, another etching process may be performed to process the conductive layer 204b into a desired pattern. Details of the etching process for processing the pattern are similar to those of the above-described etching process.

Figure 3C:
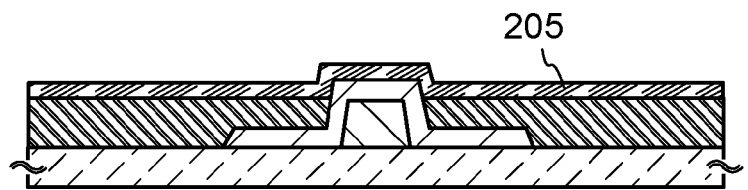

Then, an insulating film 205 functioning as a gate insulating film is formed in contact with the part of the surface of the oxide semiconductor layer 203 and the surface of the conductive layer 204b (see FIG. 3C).

The insulating film 205 can be formed by a CVD method, a sputtering method, or the like. The insulating film 205 is preferably formed so as to contain silicon oxide, silicon nitride, silicon oxynitride, aluminum oxide, gallium oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The insulating film 205 may have a single-layer structure or a stacked structure. There is no particular limitation on the thickness of the insulating film 205; the thickness is preferably small in order to ensure the operation of the transistor when the semiconductor device is miniaturized. For example, in the case of using silicon oxide, the thickness can be more than or equal to 1 nm and less than or equal to 100 nm, preferably more than or equal to 10 nm and less than or equal to 50 nm.

When the insulating film 205 is thin as described above, gate leakage due to a tunnel effect or the like becomes a problem. In order to solve the problem of gate leakage, the insulating film 205 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the insulating film 205, the thickness of the insulating film 205 can be large to prevent gate leakage while ensuring electrical characteristics. For example, hafnium oxide is preferable as a material of the gate insulating film because the relative permittivity of hafnium oxide is about 15, which is much higher than that of silicon oxide which is 3 to 4. Note that a stacked structure of a film containing a high-k material and a film containing any of silicon oxide, silicon nitride, silicon oxynitride, silicon nitride oxide, aluminum oxide, or the like may also be employed.

After the insulating film 205 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. By the second heat treatment, variation in electrical characteristics of the transistor can be reduced. In the case where the insulating film 205 contains oxygen, oxygen can be supplied to the oxide semiconductor layer 203 and oxygen vacancies in the oxide semiconductor layer 203 can be filled; thus, the oxide semiconductor layer 203 which is i-type (intrinsic) or substantially i-type can be formed.

In this embodiment, the second heat treatment is performed after the insulating film 205 is formed; however, the timing of the second heat treatment is not limited to this. For example, the second heat treatment may be performed after the gate electrode is formed. Alternatively, the first heat treatment and the second heat treatment may be performed in succession, or the first heat treatment may also serve as the second heat treatment, or the second heat treatment may also serve as the first heat treatment.

By performing at least one of the first heat treatment and the second heat treatment as described above, the oxide semiconductor layer 203 can be purified so as to contain impurities other than main components thereof as little as possible.

Figure 3D:
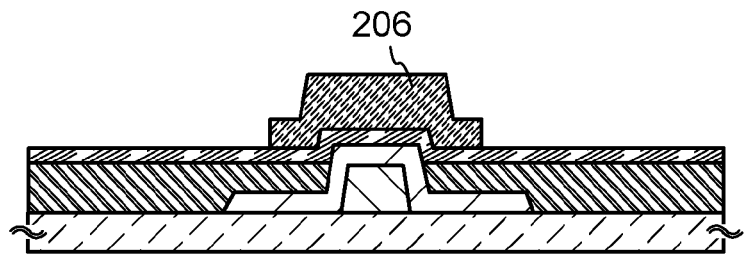

Then, the conductive layer 206 functioning as a gate electrode is formed over the insulating film 205 (see FIG. 3D). Further, the insulating film 101 and the insulating film 103 may be formed so as to cover the insulating film 205, the conductive layer 206, and the like (see FIG. 1A).

The conductive layer 206 can be formed by forming a conductive film over the insulating film 205 and then selectively etching the conductive film. The conductive film to be the conductive layer 206 can be formed by a PVD method such as a sputtering method, or a CVD method such as a plasma CVD method. The details of the manufacturing method or the material are similar to those of the conductive layer which are already described above; thus, the description thereof can be referred to. Note that although a part of the conductive layer 206 overlaps with the conductive layer 204b in the structure employed here, the invention disclosed herein is not limited to this structure.

The insulating film 101 and the insulating film 103 can be formed by a PVD method, a CVD method, or the like. The insulating film 101 and the insulating film 103 can be formed using an inorganic insulating material such as silicon oxide, silicon oxynitride, silicon nitride, hafnium oxide, aluminum oxide, or gallium oxide.

Note that the insulating film 101 and the insulating film 103 are preferably formed using a low dielectric constant material or to have a structure with low dielectric constant (e.g., a porous structure). When the dielectric constant of the insulating film 101 and the insulating film 103 is reduced, the capacitance generated between wirings or electrodes can be reduced, which results in higher speed operation.

Note that, although a stacked structure of the insulating film 101 and the insulating film 103 is employed in this embodiment, one embodiment of the invention disclosed herein is not limited thereto. A single-layer structure or a stacked structure including three or more layers can also be used for the insulating film. Alternatively, the insulating film may be omitted.

Note that the insulating film 103 is preferably formed so as to have a flat surface. By forming the insulating film 103 having a flat surface, an electrode, a wiring, or the like can be favorably formed over the insulating film 103 even in the case where the semiconductor device is miniaturized, for example.

The insulating film 103 can be flattened by a method such as a chemical mechanical polishing (CMP) process.

Through the above-described process, the transistor 207 including the purified oxide semiconductor layer 203 is completed (see FIG. 1A).

Note that after the above-described process, a variety of wirings, electrodes, or the like may be formed. The wirings or the electrodes can be formed by a method in which a conductive film is formed and then partly removed, a damascene method, a dual damascene method, or the like.

Figure 2E:
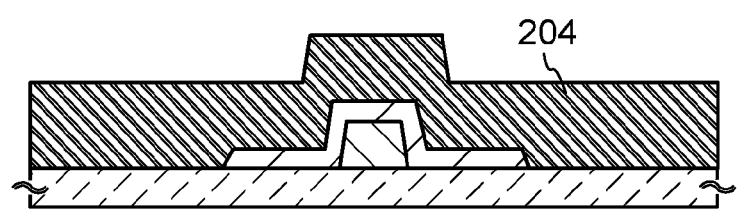

Next, another manufacturing method of the transistor 207 will be described with reference to FIGS. 4A to 4E. Since the above-described steps up to the step illustrated in FIG. 2E are also applied here, steps after the step illustrated in FIG. 2E will be described below.

Figure 4A:
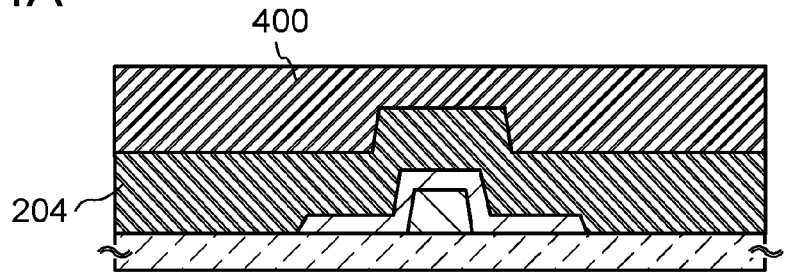
FIGS. 4A to 4E are cross-sectional views illustrating an example of a manufacturing process of the semiconductor device.

First, liquid glass, liquid photoresist, or the like is provided on the conductive film 204 and a spin coating method, an ink-jet method, or the like is performed to form a film 400 (see FIG. 4A). The film 400 is formed for the purpose of flattening the outmost surface of the transistor under manufacture. Therefore, the film 400 is called a planarizing film in this specification. The film 400 may be hardened or solidified by a treatment with light or heat.

Figure 4B:
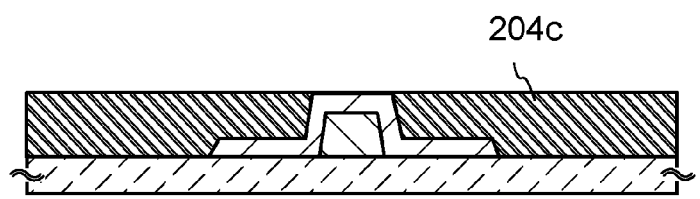
Figure 4C:
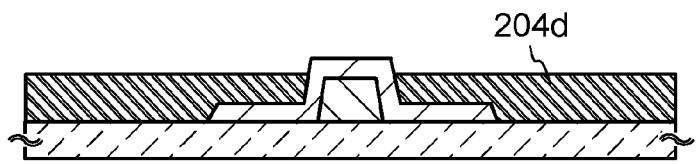
Figure 4D:
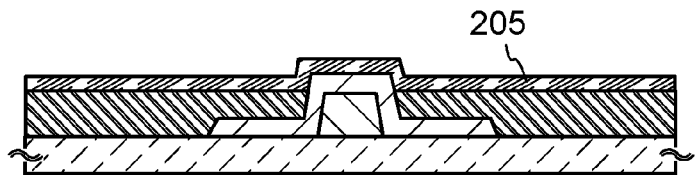
Figure 4E:
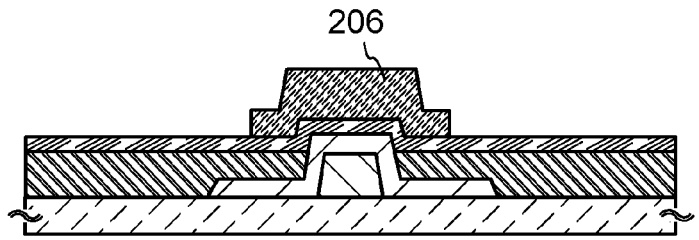

Then, an etching process is performed until the surface of the uppermost part of the oxide semiconductor layer 203 is exposed, so that a conductive film 204c is formed from the conductive film 204 (see FIG. 4B). The etching process is made to proceed, so that only the conductive film 204c is thinned and a conductive layer 204d is formed (see FIG. 4C). As a result, step height is formed by a surface of the conductive layer 204d and the part of the surface of the oxide semiconductor layer 203. Although the etching process involving two steps is performed here, the etching process may have only one step.

The step height which is formed by the conductive layer 204d and the oxide semiconductor layer 203 is preferably more than or equal to 5 nm and less than or equal to 20 nm. The path of electric current in the oxide semiconductor layer 203 is extended by the step height, and the resistance of the path of electric current is increased because the contact area between the oxide semiconductor layer 203 and the conductive layer 204e is decreased. This makes it possible to alleviate the concentration of an electric field in the transistor 207 and to suppress a short channel effect.

After that, the insulating film 205 (see FIG. 4D) and the conductive layer 206 (see FIG. 4E) are formed in the same manner as those already described; thus, the transistor 207 is obtained.

In an embodiment of the invention disclosed herein, a slimming process is performed after formation of a mask in order to further miniaturize the pattern of the mask in the above-described manner. This allows the transistor to be sufficiently miniaturized regardless of the kind of substrate. Therefore, it is possible to provide a semiconductor device which fully utilizes an advantage of an oxide semiconductor.

Further, the transistor 207 is formed over a highly flat region having a root-mean-square (RMS) roughness of 1 nm or less. This makes it possible to prevent a problem such as a short channel effect even when the transistor 207 is miniaturized; accordingly, the transistor 207 having favorable characteristics can be obtained.

The increase in flatness of the surface over which components are formed can make the thickness distribution of the oxide semiconductor layer 203 uniform; therefore, the characteristics of the transistor 207 can be improved. In addition, a decrease in coverage which may be caused by an extremely large step height can be suppressed, and a disconnection or a defective connection of the oxide semiconductor layer 203 can be prevented.

As described above, according to one embodiment of the disclosed invention, a semiconductor device which suppresses defects or maintains favorable characteristics, and achieves miniaturization can be provided.

The structures, methods, and the like described in this embodiment can be combined as appropriate with any of the structures, methods, and the like described in the other embodiments.

Embodiment 2

In this embodiment, a structure and a manufacturing method of a semiconductor device according to another embodiment of the invention disclosed herein will be described with reference to FIGS. 5A to 5C, FIGS. 6A to 6D, and FIGS. 7A to 7C.

Structure Example of Semiconductor Device

Figure 5A:
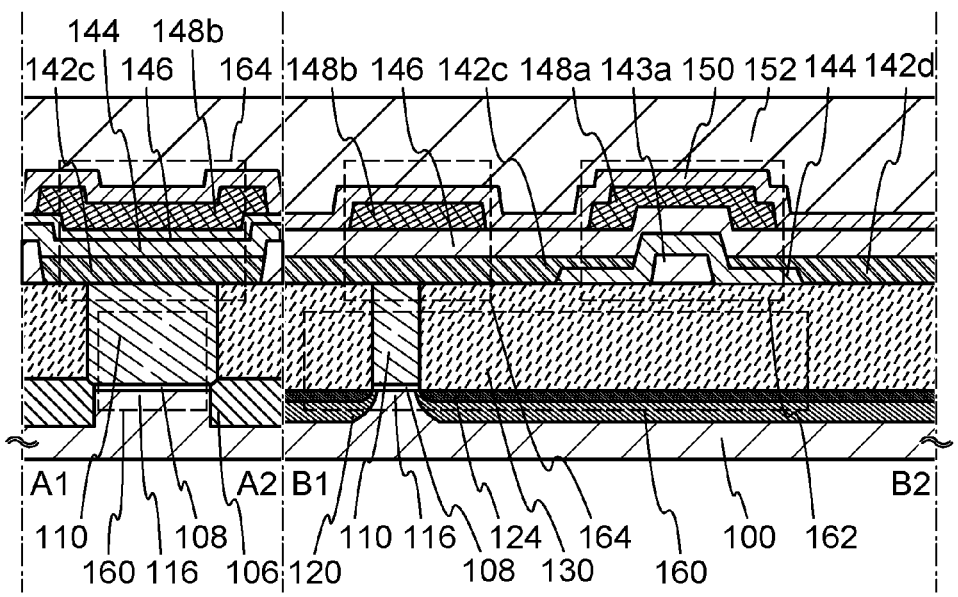
FIG. 5A, FIG. 5B, and FIG. 5C are a cross-sectional view, a plan view, and a circuit diagram, respectively, which illustrate a structure example of a semiconductor device.
Figure 5B:
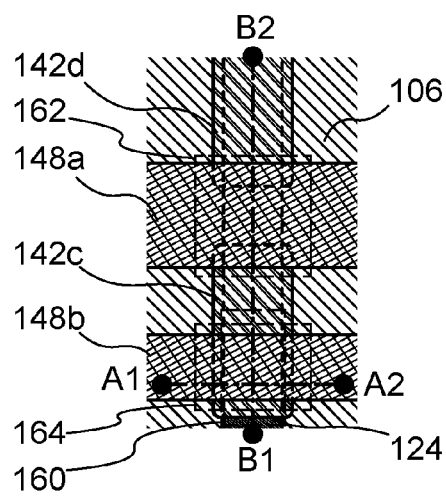
Figure 5C:
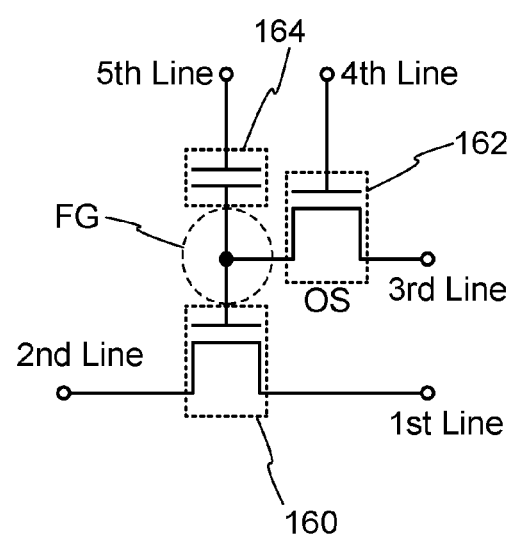

FIGS. 5A to 5C illustrate a structure example of a semiconductor device. FIG. 5A is a cross-sectional view of the semiconductor device; FIG. 5B is a plan view of the semiconductor device; and FIG. 5C illustrates a circuit configuration of the semiconductor device. Note that a structure of the semiconductor device is mainly described in this embodiment, and operation of the semiconductor device will be described in detail in the following embodiment. Note that the semiconductor device illustrated in FIGS. 5A to 5C is just an example of a semiconductor device having a predetermined function and does not exhaustively represent the semiconductor device of the invention disclosed herein. The semiconductor device according to the invention disclosed herein can have another function by changing connection of an electrode or the like as appropriate.

FIG. 5A corresponds to a cross-sectional view along line A1-A2 and line B1-B2 in FIG. 5B. The semiconductor device illustrated in FIGS. 5A and 5B includes a transistor 162 which is similar to the transistor described in the above embodiment, a transistor 160 below the transistor 162, and a capacitor 164.

Here, a semiconductor material of the transistor 162 and a semiconductor material of the transistor 160 are preferably different from each other. For example, the semiconductor material of the transistor 162 may be an oxide semiconductor, and the semiconductor material of the transistor 160 may be a semiconductor material (e.g., silicon) other than an oxide semiconductor. A transistor including an oxide semiconductor can hold charge for a long time owing to its characteristics. On the other hand, a transistor including a material other than an oxide semiconductor can operate at high speed easily.

The transistor 160 in FIGS. 5A to 5C includes a channel formation region 116 provided in a substrate 100 containing a semiconductor material (e.g., silicon), impurity regions 120 provided so that the channel formation region 116 is sandwiched therebetween, metal compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may also be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". In other words, in this specification, the term "source electrode" may include a source region and the term "drain electrode" may include a drain region.

Further, an element isolation insulating film 106 is formed over the substrate 100 so as to surround the transistor 160, and an insulating film 130 is formed to cover the transistor 160. Note that in order to realize higher integration, the transistor 160 preferably has a structure without a sidewall insulating film as illustrated in FIGS. 5A and 5B. On the other hand, in the case where the characteristics of the transistor 160 have priority, a sidewall insulating film may be provided on a side surface of the gate electrode 110, and the impurity regions 120 may include a region having a different impurity concentration.

The structure of the transistor 162 in FIGS. 5A to 5C is similar to the structure of the transistor 207 in the above embodiment. That is, in the transistor 162, an oxide semiconductor layer 144 is provided over an insulating layer 143a, and conductive layers 142c and 142d which function as a source electrode and a drain electrode and are separated from each other with the insulating layer 143a serving as a boundary are formed in contact with the oxide semiconductor layer 144. A gate insulating film 146 and a gate electrode 148a are provided over those components. Furthermore, an insulating film 150 and an insulating film 152 are provided thereover so as to cover the transistor 162. Note that in this embodiment, the conductive layer 142c of the transistor 162 is connected to the gate electrode 110 of the transistor 160. Needless to say, the transistor 907 can also be used instead of the transistor 162.

The capacitor 164 in FIGS. 5A to 5C includes the conductive layer 142c, the gate insulating film 146, and an electrode 148b. In other words, the conductive layer 142c functions as one electrode of the capacitor 164, and the electrode 148b functions as the other electrode of the capacitor 164. Note that the electrode 148b is formed in a process similar to that of the gate electrode 148a of the transistor 162.

Note that in the case where no capacitor is needed, a structure in which the capacitor 164 is not provided is also possible.

In this embodiment, the transistor 162 and the capacitor 164 are provided so as to overlap with the transistor 160. By employing such a layout, higher integration can be realized. For example, given that the minimum feature size is F, the area occupied by the semiconductor device can be 15 $F^2$ to 25 $F^2$.

Note that the structure of a semiconductor device according to the invention disclosed herein is not limited to that illustrated in FIGS. 5A to 5C. Since the technical idea of an embodiment of the invention disclosed herein is to form a stacked structure of a transistor including an oxide semiconductor in a channel formation region and a transistor including semiconductor material other than an oxide semiconductor in a channel formation region, the details such as a connection relationship of electrodes can be changed as appropriate.

<Manufacturing Method of Semiconductor Device>

Next, an example of a manufacturing method of the semiconductor device will be described with reference to FIGS. 6A to 6D and FIGS. 7A to 7C. A manufacturing method of the transistor 162 is similar to that in the above embodiment; thus, a manufacturing method of the transistor 160 will be mainly described here.

Figure 6A:
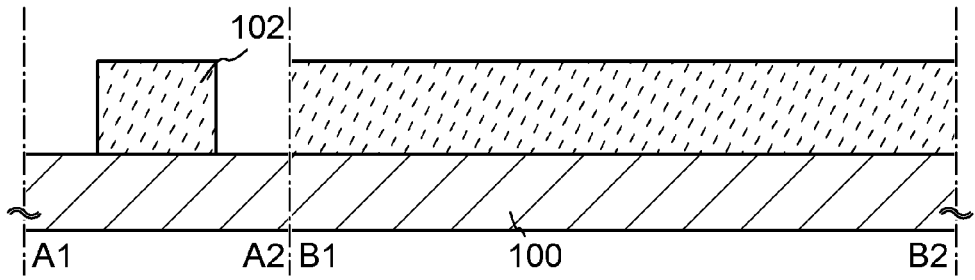
FIGS. 6A to 6D are cross-sectional views illustrating a manufacturing process of the semiconductor device.
Figure 6B:
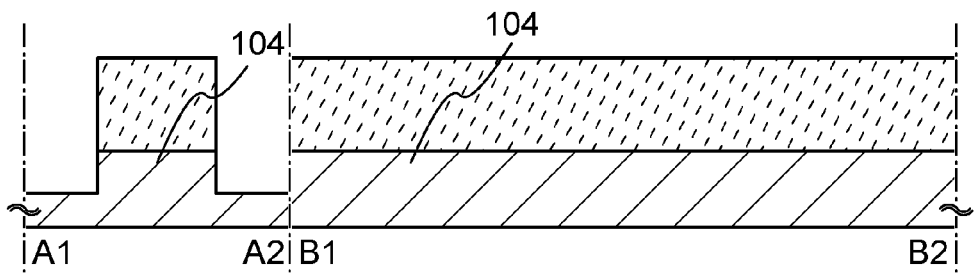

First, the substrate 100 containing a semiconductor material is prepared (see FIG. 6A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 containing a semiconductor material. Here, an example of the case where a single crystal silicon substrate is used as the substrate 100 containing a semiconductor material is described. Note that the term "SOI substrate" generally means a substrate where a silicon semiconductor film is provided over an insulating surface. In this specification and the like, the term "SOI substrate" also means a substrate where a semiconductor film containing a material other than silicon is provided over an insulating surface. That is, a semiconductor film included in the "SOI substrate" is not limited to a silicon semiconductor film. Moreover, the SOI substrate can be a substrate having a structure where a semiconductor film is provided over an insulating substrate such as a glass substrate with an insulating film interposed therebetween.

It is particularly preferable that a single crystal semiconductor substrate of silicon or the like be used as the substrate 100 containing a semiconductor material because the speed of read operation of the semiconductor device can be increased.

Note that an impurity element may be added to a region which later functions as the channel formation region 116 of the transistor 160, in order to control the threshold voltage of the transistor. Here, an impurity element imparting conductivity is added so that the threshold voltage of the transistor 160 becomes positive. When the semiconductor material is silicon, the impurity imparting conductivity may be boron, aluminum, gallium, or the like. Note that it is preferable to perform heat treatment after adding an impurity element, in order to activate the impurity element or reduce defects which may be generated during addition of the impurity element.

Next, a protective layer 102 serving as a mask for forming an element isolation insulating film is formed over the substrate 100 (see FIG. 6A). As the protective layer 102, an insulating film containing a material such as silicon oxide, silicon nitride, silicon oxynitride, or the like can be used, for example.

Next, a part of the substrate 100 in a region not covered with the protective layer 102 (i.e., in an exposed region) is removed by etching using the protective layer 102 as a mask. Thus, a semiconductor region 104 isolated from other semiconductor regions is formed (see FIG. 6B). As the etching, dry etching is preferably performed, but wet etching may be performed. An etching gas and an etchant can be selected as appropriate depending on a material to be etched.

Figure 6C:
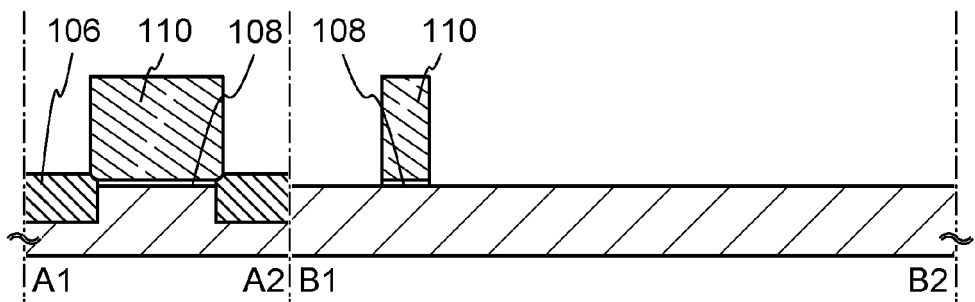

Then, an insulating film is formed so as to cover the semiconductor region 104, and the insulating film in a region overlapping with the semiconductor region 104 is selectively removed; thus, the element isolation insulating film 106 is formed (see FIG. 6C). The insulating film is formed using silicon oxide, silicon nitride, silicon oxynitride, or the like. As a method for removing the insulating film, any of an etching process, a polishing process such as a chemical mechanical polishing (CMP) process, and the like can be employed. Note that the protective layer 102 is removed after the formation of the semiconductor region 104 or after the formation of the element isolation insulating film 106.

Next, an insulating film is formed over a surface of the semiconductor region 104, and a layer containing a conductive material is formed over the insulating film.

The insulating film is to be a gate insulating film later and can be formed by performing heat treatment (thermal oxidation treatment, thermal nitridation treatment, or the like) on the surface of the semiconductor region 104, for example. Instead of heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, hydrogen, and the like. It is needless to say that the insulating film may be formed by a CVD method, a sputtering method, or the like. The insulating film preferably has a single-layer structure or a stacked structure including silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The insulating film can have a thickness of more than or equal to 1 nm and less than or equal to 100 nm, preferably, more than or equal to 10 nm and less than or equal to 50 nm, for example.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the formation method of the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

After that, the insulating film and the layer containing a conductive material are selectively etched; thus, the gate insulating film 108 and the gate electrode 110 are formed (see FIG. 6C).

Figure 6D:
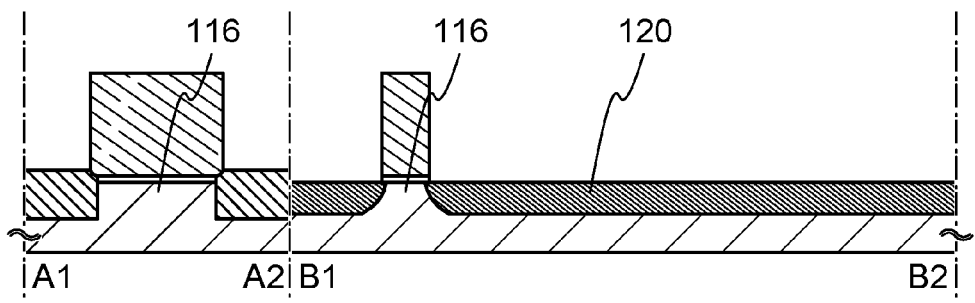

Next, phosphorus (P), arsenic (As), or the like is added to a part of the semiconductor region 104, so that the channel formation region 116 and the impurity regions 120 are formed (see FIG. 6D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably set high when a semiconductor element is highly miniaturized.

Note that a sidewall insulating film may be formed around the gate electrode 110, and an impurity region to which the impurity element is added at a different concentration may be formed.

Figure 7A:
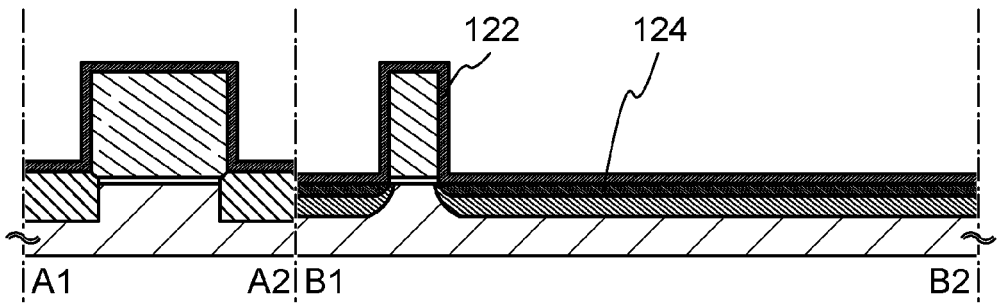
FIGS. 7A to 7C are cross-sectional views illustrating the manufacturing process of the semiconductor device.

Next, a metal layer 122 is formed so as to cover the gate electrode 110, the impurity regions 120, and the like (see FIG. 7A). The metal layer 122 can be formed by any of a variety of film formation methods such as a vacuum evaporation method, a sputtering method, and a spin coating method. The metal layer 122 is preferably formed using a metal material which forms a low-resistance metal compound by reacting with the semiconductor material contained in the semiconductor region 104. Examples of such a metal material are titanium, tantalum, tungsten, nickel, cobalt, platinum, and the like.

Next, heat treatment is performed so that the metal layer 122 reacts with the semiconductor material. Thus, the metal compound regions 124 that are in contact with the impurity regions 120 are formed (see FIG. 7A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 7B:
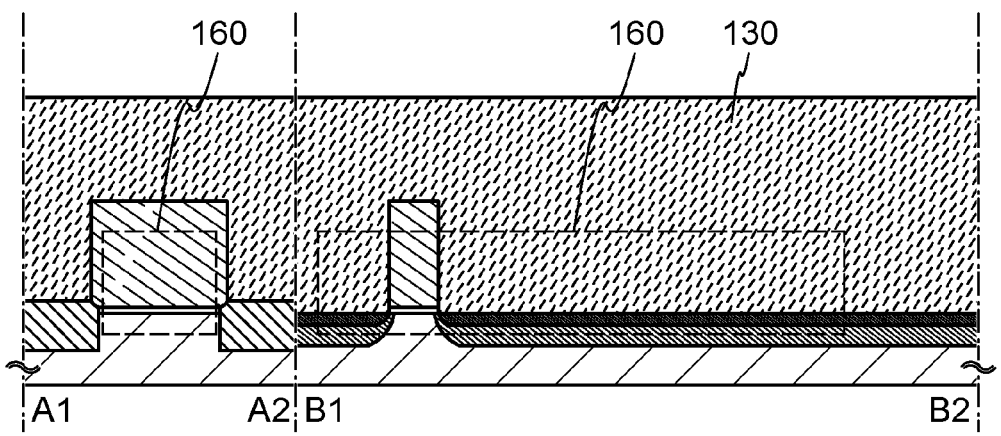

Next, the insulating film 130 is formed so as to cover the components formed in the above steps (see FIG. 7B). The insulating film 130 can be formed using a material including an inorganic insulating material such as silicon oxide, silicon oxynitride, silicon nitride, or aluminum oxide. It is particularly preferable to use a low dielectric constant (low-k) material for the insulating film 130 because capacitance due to overlap of electrodes or wirings can be sufficiently reduced. Note that a porous insulating film containing such a material may be employed as the insulating film 130. The porous insulating film has a lower dielectric constant than an insulating film with high density and thus makes it possible to further reduce capacitance due to electrodes or wirings. Alternatively, the insulating film 130 can be formed using an organic insulating material such as polyimide or an acrylic resin. Note that although a single-layer structure of the insulating film 130 is used in this embodiment, an embodiment of the invention disclosed herein is not limited to this example. A stacked structure including two or more layers may be employed.

Through the above-described process, the transistor 160 is formed with the use of the substrate 100 containing a semiconductor material (see FIG. 7B). A feature of the transistor 160 is that it can operate at high speed. With the use of that transistor as a transistor for reading, data can be read at high speed.

Figure 7C:
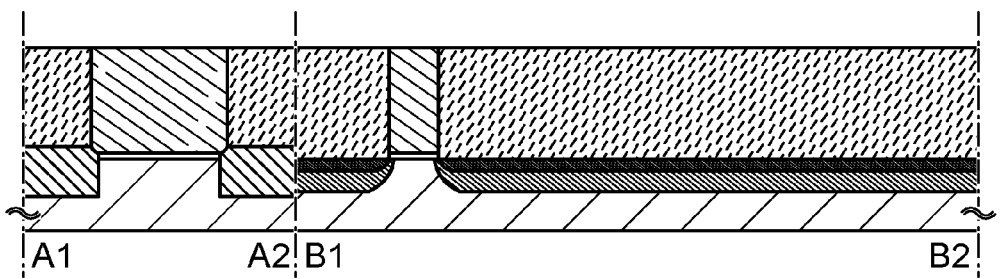

Then, as treatment performed before the transistor 162 and the capacitor 164 are formed, a CMP process is performed on the insulating film 130 so that an upper surface of the gate electrode 110 is exposed (see FIG. 7C). As treatment for exposing the upper surface of the gate electrode 110, an etching process or the like can also be employed instead of the CMP process; in order to improve the characteristics of the transistor 162, a surface of the insulating film 130 is preferably made as flat as possible. For example, the insulating film 130 is flattened so that the root-mean-square (RMS) roughness of the surface of the insulating film 130 becomes 1 nm or less. This makes it possible to improve the characteristics of a semiconductor device formed over the insulating film 130.

Note that before or after each of the above steps, a step of forming an electrode, a wiring, a semiconductor film, an insulating film, or the like may be further performed. For example, when the wiring has a multi-layer structure including a stack of insulating films and conductive films, a highly integrated semiconductor device can be realized.

Then, the transistor 162 and the capacitor 164 are formed; thus, the semiconductor device is completed.

The structures, methods, and the like described in this embodiment can be combined as appropriate with any of the structures, methods, and the like described in the other embodiments.

Embodiment 3

In this embodiment, an example of application of a semiconductor device according to one embodiment of the invention disclosed herein will be described with reference to FIGS. 8A1, 8A2, and 8B. Here, an example of a memory device will be described. Note that in some circuit diagrams, "OS" is written beside a transistor in order to indicate that the transistor includes an oxide semiconductor.

In a semiconductor device which can be used as a memory device, which is illustrated in FIG. 8A1, a first wiring (1st Line) is electrically connected to a source electrode (or a drain electrode) of a transistor 1000. A second wiring (2nd Line) is electrically connected to a drain electrode (or a source electrode) of the transistor 1000. A third wiring (3rd Line) is electrically connected to a source electrode (or a drain electrode) of a transistor 1010. A fourth wiring (4th Line) is electrically connected to a gate electrode of the transistor 1010. Furthermore, a gate electrode of the transistor 1000 and the drain electrode (or the source electrode) of the transistor 1010 are electrically connected to one electrode of a capacitor 1020. A fifth wiring (5th Line) is electrically connected to the other electrode of the capacitor 1020.

Here, a transistor including an oxide semiconductor is used as the transistor 1010. For example, the transistor described in the above embodiment can be used as the transistor including an oxide semiconductor. A transistor including an oxide semiconductor has a characteristic of a significantly small off-state current. For that reason, the potential of the gate electrode of the transistor 1000 can be held for an extremely long period by turning off the transistor 1010. Furthermore, with the use of the transistor described in the above embodiment, a short channel effect of the transistor 1010 can be suppressed, and miniaturization can be achieved. By providing the capacitor 1020, holding of charge applied to the gate electrode of the transistor 1000 and reading of the held data can be performed more easily. Here, the capacitor described in the above embodiment can be used as the capacitor 1020, for example.

In addition, a transistor including a semiconductor material other than an oxide semiconductor is used as the transistor 1000. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at high speed easily. Here, the transistor described in the above embodiment can be used as the transistor including a semiconductor material other than an oxide semiconductor, for example.

Alternatively, a structure in which the capacitor 1020 is not provided is also possible as illustrated in FIG. 8B.

The semiconductor device in FIG. 8A1 utilizes an advantage that the potential of the gate electrode of the transistor 1000 can be held, and can thus write, hold, and read data as follows.

First, writing and holding of data will be described. First, the potential of the fourth wiring is set to a potential at which the transistor 1010 is on, so that the transistor 1010 is turned on. Accordingly, the potential of the third wiring is supplied to the gate electrode of the transistor 1000 and the capacitor 1020. That is, predetermined charge is supplied to the gate electrode of the transistor 1000 (writing). Here, one of two charges supplying different potentials (hereinafter, a charge supplying a low potential is referred to as charge $Q_L$ and a charge supplying a high potential is referred to as charge $Q_H$) is supplied. Note that charges supplying three or more different potentials may be applied in order to improve storage capacity. After that, the potential of the fourth wiring is set to a potential at which the transistor 1010 is off, so that the transistor 1010 is turned off. Thus, the charge supplied to the gate electrode of the transistor 1000 is held (holding).

Since the off-state current of the transistor 1010 is significantly small, the charge of the gate electrode of the transistor 1000 is held for a long time.

Next, reading of data will be described. By supplying an appropriate potential (reading potential) to the fifth wiring while a predetermined potential (a constant potential) is supplied to the first wiring, the potential of the second wiring varies depending on the amount of charge held in the gate electrode of the transistor 1000. This is generally because, when the transistor 1000 is an n-channel transistor, an apparent threshold voltage $V_{th\_H}$ in the case where charge $Q_H$ is supplied to the gate electrode of the transistor 1000 is lower than an apparent threshold voltage $V_{th\_L}$ in the case where charge $Q_L$ is supplied to the gate electrode of the transistor 1000. Here, an apparent threshold voltage refers to the potential of the fifth wiring, which is needed to turn on the transistor 1000. Thus, when the potential of the fifth wiring is set to a potential $V_0$ that is an intermediate potential between the apparent threshold voltages $V_{th\_H}$ and $V_{th\_L}$, charge supplied to the gate electrode of the transistor 1000 can be determined. For example, in the case where charge $Q_H$ is supplied in writing, when the potential of the fifth wiring is $V_0$ ($>V_{th\_H}$), the transistor 1000 is turned on. In the case where charge $Q_L$ is supplied in writing, even when the potential of the fifth wiring is $V_0$ ($<V_{th\_L}$), the transistor 1000 remains in an off state. Therefore, the held data can be read by measuring the potential of the second wiring.

Note that in the case where memory cells are arrayed to be used, it is necessary to read data only from an intended memory cell. In the case where data of a predetermined memory cell are read and data of the other memory cells are not read, a potential at which the transistor 1000 is off regardless of the state of the gate electrode, that is, a potential lower than the apparent threshold voltage $V_{th\_H}$ may be supplied to fifth wirings of the memory cells that are not a target for reading. Alternatively, a potential at which the transistor 1000 is on regardless of the state of the gate electrode, that is, a potential higher than the apparent threshold voltage $V_{th\_L}$ may be supplied to the fifth wirings.

Next, rewriting of data will be described. Rewriting of data is performed in a manner similar to that of the writing and holding of data. That is, the potential of the fourth wiring is set to a potential at which the transistor 1010 is on, so that the transistor 1010 is turned on. Accordingly, the potential of the third wiring (a potential for new data) is supplied to the gate electrode of the transistor 1000 and the capacitor 1020. After that, the potential of the fourth wiring is set to a potential at which the transistor 1010 is off, so that the transistor 1010 is turned off. Accordingly, charge for new data is supplied to the gate electrode of the transistor 1000.

In the semiconductor device according to the invention disclosed herein, data can be directly rewritten by another writing of data as described above. Therefore, extraction of charge from a floating gate with the use of a high voltage which is necessary in a flash memory or the like is not needed, and thus a reduction in operation speed due to erasing operation can be suppressed. In other words, high-speed operation of the semiconductor device can be realized.

Note that the drain electrode (or the source electrode) of the transistor 1010 is electrically connected to the gate electrode of the transistor 1000 and therefore has a function similar to that of a floating gate of a floating gate transistor used for a nonvolatile memory element. Therefore, in drawings, a portion where the drain electrode (or the source electrode) of the transistor 1010 is electrically connected to the gate electrode of the transistor 1000 is called a floating gate portion FG in some cases. When the transistor 1010 is off, the floating gate portion FG can be regarded as being embedded in an insulator and thus charge is held in the floating gate portion FG. The off-state current of the transistor 1010 including an oxide semiconductor is smaller than or equal to $1/100000$ of the off-state current of a transistor including a silicon semiconductor or the like; thus, loss of the charge accumulated in the floating gate portion FG due to leakage of the transistor 1010 is negligible. That is, with the transistor 1010 including an oxide semiconductor, a nonvolatile memory device which can hold data without being supplied with power can be realized.

For example, when the off-state current of the transistor 1010 at room temperature is 10 zA (1 zA (zeptoampere) is $1 \times 10^{-21}$ A) or less and the capacitance of the capacitor 1020 is approximately 10 fF, data can be held for $10^4$ seconds or longer. It is needless to say that the holding time depends on transistor characteristics and capacitance.

Further, in that case, the problem of deterioration of a gate insulating film (tunnel insulating film), which has been a problem of a conventional floating gate transistor, does not exist. That is, the problem of deterioration of a gate insulating film due to injection of electrons into a floating gate, which is a conventional problem, can be solved. This means that there is no limit on the number of writing times in principle. Furthermore, a high voltage needed for writing or erasing in a conventional floating gate transistor is not necessary.

Components such as transistors in the semiconductor device in FIG. 8A1 can be regarded as including resistors and capacitors as illustrated in FIG. 8A2. That is, in FIG. 8A2, the transistor 1000 and the capacitor 1020 are each regarded as including a resistor and a capacitor. R1 and C1 denote the resistance and the capacitance of the capacitor 1020, respectively. The resistance R1 corresponds to the resistance of the insulating film included in the capacitor 1020. R2 and C2 denote the resistance and the capacitance of the transistor 1000, respectively. The resistance R2 corresponds to the resistance of the gate insulating film at the time when the transistor 1000 is on. The capacitance C2 corresponds to a so-called gate capacitance (capacitance formed between the gate electrode and the source or drain electrode, and capacitance formed between the gate electrode and the channel formation region).

The value of resistance (also referred to as effective resistance) between the source electrode and the drain electrode in the case where the transistor 1010 is off is denoted by ROS. When both the resistance R1 and the resistance R2 are higher than or equal to ROS under the condition that gate leakage of the transistor 1010 is sufficiently small, a period for holding charge (also referred to as a data retention period) is determined mainly by the off-state current of the transistor 1010.

On the other hand, when the above relations are not satisfied, it is difficult to secure a sufficient retention period even if the off-state current of the transistor 1010 is sufficiently small. This is because a leakage current other than the off-state current of the transistor 1010 (e.g., a leakage current generated between the source electrode and the gate electrode) is large. Thus, it is preferable that the semiconductor device disclosed in this embodiment satisfy the above relations.

Moreover, the capacitance C1 is preferably larger than or equal to the capacitance C2. This is because if the capacitance C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be made small.

When the above relation is satisfied, a more favorable semiconductor device can be realized. Note that the resistance R1 and the resistance R2 are controlled by the gate insulating film of the transistor 1000 and the insulating film of the capacitor 1020. The same can be said to the capacitance C1 and the capacitance C2. Therefore, it is preferable that the material, the thickness, and the like of the gate insulating film be set as appropriate to satisfy the above relations.

In the semiconductor device of this embodiment, the floating gate portion FG has a function equivalent to that of a floating gate of a floating gate transistor in a flash memory or the like, but the floating gate portion FG of this embodiment has a feature essentially different from that of the floating gate of the flash memory or the like. In a flash memory, since a voltage applied to a control gate is high, it is necessary to keep a proper distance between cells in order to prevent the potential from adversely affecting a floating gate of the adjacent cell. This is one factor inhibiting higher integration of semiconductor devices. The factor is attributed to the following basic principle of a flash memory: a tunneling current is generated by application of a high electric field.

Further, because of the above principle of a flash memory, deterioration of an insulating film proceeds and thus another problem of the limit on the number of rewriting times (approximately $10^4$ to $10^5$ times) arises.

The semiconductor device according to the invention disclosed herein is operated by switching of a transistor including an oxide semiconductor and does not use the above-described principle of charge injection by a tunneling current. That is, unlike a flash memory, a high electric field for injection of charge is not necessary. Accordingly, it is not necessary to consider an influence of a high electric field from a control gate on an adjacent cell, which facilitates high integration.

Further, since the principle of charge injection by a tunneling current is not used, it can be said that there is no cause for deterioration of a memory cell. In other words, the semiconductor device according to the invention disclosed herein has higher durability and reliability than a flash memory.

In addition, the semiconductor device according to the invention disclosed herein has advantages over a flash memory in that a high electric field is unnecessary and a large peripheral circuit (such as a booster circuit) is unnecessary.

In the case where the relative permittivity $\in r1$ of the insulating film (area: S1) whose capacitance is the capacitance C1 is made different from the relative permittivity $\in r2$ of the insulating film (area: S2) whose capacitance is the capacitance C2, the doubled area S2 can be easily larger than or equal to the area S1 (it is desirable that the area S2 is larger than or equal to the area S1) and C1 can be easily larger than or equal to C2. Specifically, for example, a film formed of a high-k material such as hafnium oxide or a stack including a film formed of a high-k material such as hafnium oxide and a film formed of an oxide semiconductor is used for the insulating film whose capacitance is the capacitance C1 so that $\in r1$ can be set to 10 or more, preferably 15 or more, and silicon oxide is used for the insulating film whose capacitance is the capacitance C2 so that $\in r2$ can be set to 3 to 4.

A combination of such structures enables higher integration of the semiconductor device according to the invention disclosed herein.

Note that an n-channel transistor (an n-type transistor) in which electrons are carriers is used in the above description; it is needless to say that a p-channel transistor in which holes are carriers can be used instead of the n-channel transistor.

As described above, the semiconductor device according to an embodiment of the invention disclosed herein has a non-volatile memory cell that includes a writing transistor in which a leakage current between a source and a drain in an off state (an off-state current) is small, a reading transistor including a semiconductor material different from that of the writing transistor, and a capacitor.

With a normal silicon semiconductor, it is difficult to reduce the leakage current (the off-state current) to approximately 100 zA ($1 \times 10^{-19}$ A) or less at ambient temperature (e.g., 25° C.), whereas this can be achieved with a transistor including an oxide semiconductor which is processed under an appropriate condition. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, the rise of a writing pulse given to the floating gate portion FG can be very sharp. Further, since the off-state current is small, the amount of charge held in the floating gate portion FG can be reduced. That is, by using a transistor including an oxide semiconductor as the writing transistor, rewriting of data can be performed at high speed.

Although there is no limitation on the off-state current of the reading transistor, a transistor that operates at high speed is preferably used as the reading transistor in order to increase the readout speed. For example, a transistor having a switching rate of 1 nanosecond or lower is preferably used as the reading transistor.

In this manner, when a transistor including an oxide semiconductor is used as a writing transistor, and a transistor including a semiconductor material other than an oxide semiconductor is used as a reading transistor, a semiconductor device capable of holding data for a long time and reading data at high speed, which can be used as a memory device, can be obtained.

Furthermore, with the use of the transistor described in the above embodiment as a writing transistor, a short channel effect of the writing transistor can be suppressed, and miniaturization can be achieved. Accordingly, higher integration of a semiconductor device which can be used as a memory device can be achieved.

The structures, methods, and the like described in this embodiment can be combined as appropriate with any of the structures, methods, and the like described in the other embodiments.

Embodiment 4

In this embodiment, examples of application of a semiconductor device according to one embodiment of the invention disclosed herein will be described with reference to FIGS. 9A and 9B and FIGS. 10A to 10C. Here, an example of a memory device will be described. Note that in some circuit diagrams, "OS" is written beside a transistor in order to indicate that the transistor includes an oxide semiconductor.

Figure 9A:
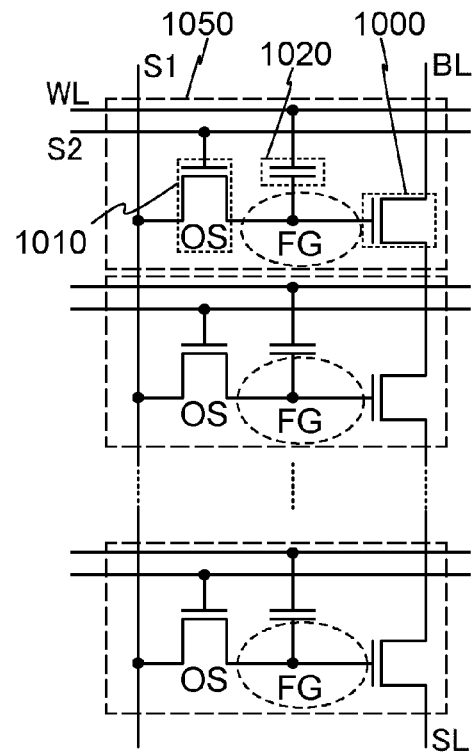
FIGS. 9A and 9B show application examples of a semiconductor device.
Figure 9B:
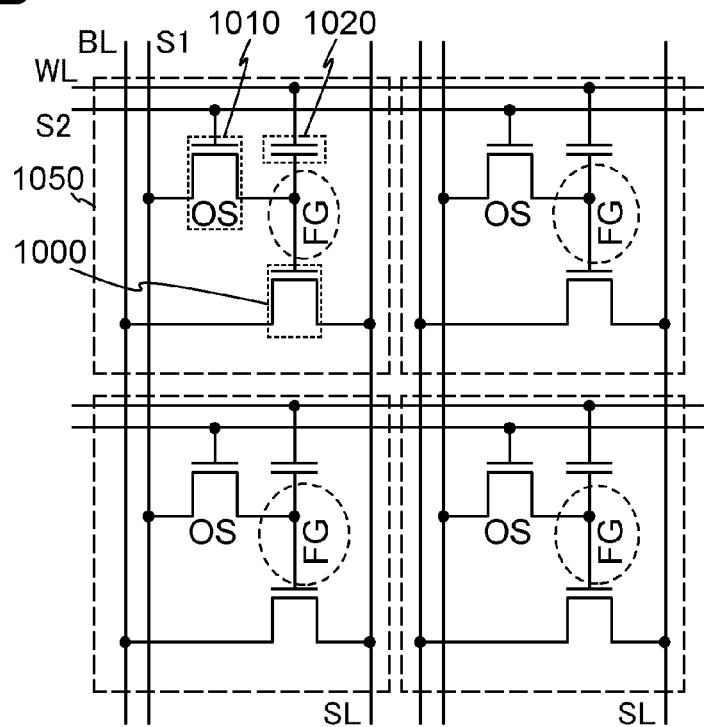

FIGS. 9A and 9B are circuit diagrams of semiconductor devices, which can be used as memory devices, each including a plurality of semiconductor devices (hereinafter also referred to as memory cells 1050) illustrated in FIG. 8A1. FIG. 9A is a circuit diagram of a so-called NAND semiconductor device in which the memory cells 1050 are connected in series, and FIG. 9B is a circuit diagram of a so-called NOR semiconductor device in which the memory cells 1050 are connected in parallel.

The semiconductor device in FIG. 9A includes a source line SL, a bit line BL, a first signal line S1, a plurality of second signal lines S2, a plurality of word lines WL, and a plurality of memory cells 1050. In FIG. 9A, one source line SL and one bit line BL are provided in the semiconductor device; however, an embodiment of the invention disclosed herein is not limited to this structure. A plurality of source lines SL and a plurality of bit lines BL may be provided.

In each of the memory cells 1050, the gate electrode of the transistor 1000, the drain electrode (or the source electrode) of the transistor 1010, and one electrode of the capacitor 1020 are electrically connected to one another. The first signal line S1 and the source electrode (or the drain electrode) of the transistor 1010 are electrically connected to each other, and the second signal line S2 and the gate electrode of the transistor 1010 are electrically connected to each other. The word line WL and the other electrode of the capacitor 1020 are electrically connected to each other.

Further, the source electrode of the transistor 1000 included in the memory cell 1050 is electrically connected to the drain electrode of the transistor 1000 in the adjacent memory cell 1050. The drain electrode of the transistor 1000 included in the memory cell 1050 is electrically connected to the source electrode of the transistor 1000 in the adjacent memory cell 1050. Note that the drain electrode of the transistor 1000 included in the memory cell 1050 at one end of the plurality of memory cells connected in series is electrically connected to the bit line BL. The source electrode of the transistor 1000 included in the memory cell 1050 at the other end of the plurality of memory cells connected in series is electrically connected to the source line SL.

In the semiconductor device in FIG. 9A, writing operation and reading operation are performed for each row. The writing operation is performed as follows. A potential at which the transistor 1010 is on is supplied to the second signal line S2 of a row where writing is to be performed, so that the transistor 1010 of the row where writing is to be performed is turned on. Accordingly, the potential of the first signal line S1 is supplied to the gate electrode of the transistor 1000 of the specified row, so that predetermined charge is given to the gate electrode. Thus, data can be written to the memory cell of the specified row.

Further, the reading operation is performed as follows. First, a potential at which the transistor 1000 is on regardless of charge given to the gate electrode of the transistor 1000 is supplied to the word lines WL of the rows other than the row where reading is to be performed, so that the transistors 1000 of the rows other than the row where reading is to be performed are turned on. Then, a potential (reading potential) at which an on state or an off state of the transistor 1000 is determined depending on charge of the gate electrode of the transistor 1000 is supplied to the word line WL of the row where reading is to be performed. After that, a constant potential is supplied to the source line SL so that a reading circuit (not shown) connected to the bit line BL is operated. Here, the plurality of transistors 1000 between the source line SL and the bit line BL are turned on except the transistor 1000 of the row where reading is to be performed; therefore, conductance between the source line SL and the bit line BL is determined by the state of the transistor 1000 (whether on or off) of the row where reading is to be performed. Since the conductance of the transistor varies depending on the charge in the gate electrode of the transistor 1000 of the row where reading is to be performed, the potential of the bit line BL also varies accordingly. By reading the potential of the bit line BL with the reading circuit, data can be read from the memory cell of the specified row.

The semiconductor device in FIG. 9B includes a plurality of source lines SL, a plurality of bit lines BL, a plurality of first signal lines S1, a plurality of second signal lines S2, a plurality of word lines WL, and a plurality of memory cells 1050. A gate electrode of the transistor 1000, the drain electrode (or the source electrode) of the transistor 1010, and one electrode of the capacitor 1020 are electrically connected to one another. The source line SL and the source electrode of the transistor 1000 are electrically connected to each other. The bit line BL and the drain electrode of the transistor 1000 are electrically connected to each other. The first signal line S1 and the source electrode (or the drain electrode) of the transistor 1010 are electrically connected to each other, and the second signal line S2 and the gate electrode of the transistor 1010 are electrically connected to each other. The word line WL and the other electrode of the capacitor 1020 are electrically connected to each other.

In the semiconductor device in FIG. 9B, writing operation and reading operation are performed for each row. The writing operation is performed in a manner similar to that of the semiconductor device in FIG. 9A. The reading operation is performed as follows. First, a potential at which the transistor 1000 is off regardless of charge given to the gate electrode of the transistor 1000 is supplied to the word lines WL of the rows other than the row where reading is to be performed, so that the transistors 1000 of the rows other than the row where reading is to be performed are turned off. Then, a potential (reading potential) at which an on state or an off state of the transistor 1000 is determined depending on charge of the gate electrode of the transistor 1000 is supplied to the word line WL of the row where reading is to be performed. After that, a constant potential is supplied to the source line SL, so that a reading circuit (not shown) connected to the bit line BL is operated. Here, conductance between the source line SL and the bit line BL is determined by the state of the transistor 1000 (whether on or off) of the row where reading is to be performed. That is, the potential of the bit line BL depends on charge of the gate electrode of the transistor 1000 of the row where reading is to be performed. By reading the potential of the bit line BL with the reading circuit, data can be read from the memory cell of the specified row.

Although the amount of data which can be held in each of the memory cells 1050 is one bit in the above description, the structure of the semiconductor device of this embodiment is not limited to this example. The amount of data which is held in each of the memory cells 1050 may be increased by preparing three or more kinds of potentials to be supplied to the gate electrode of the transistor 1000. For example, in the case where four kinds of potentials are supplied to the gate electrode of the transistor 1000, data of two bits can be held in each of the memory cells.

Next, examples of a reading circuit which can be used for the semiconductor devices illustrated in FIGS. 9A and 9B and the like will be described with reference to FIGS. 10A to 10C.

Figure 10A:
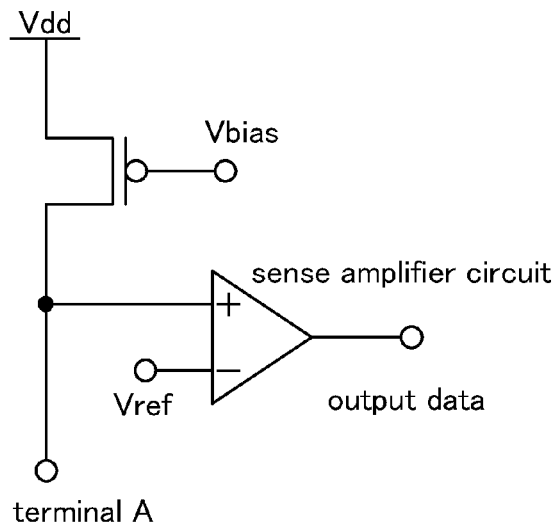
FIGS. 10A to 10C show application examples of a semiconductor device.

FIG. 10A illustrates an outline of the reading circuit. The reading circuit includes a transistor and a sense amplifier circuit.

At the time of reading data, a terminal A is connected to a bit line BL to which a memory cell from which data is to be read is connected. Further, a bias potential Vbias is applied to a gate electrode of the transistor so that the potential of the terminal A is controlled.

The resistance of the memory cell 1050 varies depending on held data. Specifically, when the transistor 1000 of the selected memory cell 1050 is on, the memory cell 1050 has a low resistance, whereas when the transistor 1000 of the selected memory cell 1050 is off, the memory cell 1050 has a high resistance.

When the memory cell has a high resistance, the potential of the terminal A is higher than a reference potential Vref and the sense amplifier circuit outputs a potential corresponding to the potential of the terminal A. On the other hand, when the memory cell has a low resistance, the potential of the terminal A is lower than the reference potential Vref and the sense amplifier circuit outputs a potential corresponding to the potential of the terminal A.

In this manner, by using the reading circuit, data can be read from the memory cell. Note that the reading circuit of this embodiment is one example. Another circuit may be used. The reading circuit may further include a precharge circuit. Instead of the reference potential Vref, a reference bit line may be connected to the sense amplifier circuit.

Figure 10B:
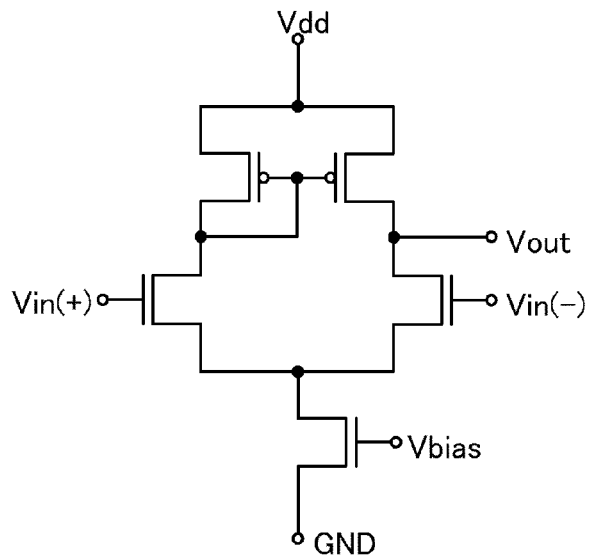

FIG. 10B illustrates a differential sense amplifier which is an example of sense amplifier circuits. The differential sense amplifier has input terminals Vin(+) and Vin(−) and an output terminal Vout, and amplifies a difference between potentials of the input terminals Vin(+) and Vin(−). If Vin(+)>Vin(−), the output from Vout is relatively high, whereas if Vin(+)<Vin (−), the output from Vout is relatively low. In the case where the differential sense amplifier is used for the reading circuit, one of the input terminals Vin(+) and Vin(−) is connected to the terminal A, and the reference potential Vref is supplied to the other of the input terminals Vin(+) and Vin(−).

Figure 10C:
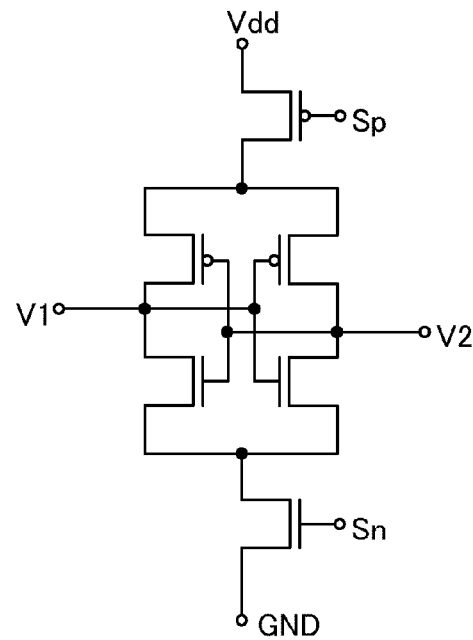

FIG. 10C illustrates a latch sense amplifier which is an example of sense amplifier circuits. The latch sense amplifier has input/output terminals V1 and V2 and input terminals for control signals Sp and Sn. First, the control signal Sp is set high and the control signal Sn is set low, and a power supply potential Vdd is interrupted. Then, potentials V1in and V2in to be compared are supplied to the input/output terminals V1 and V2. After that, the control signal Sp is set low and the control signal Sn is set high, and the power supply potential Vdd is supplied. If the potentials V1in and V2in to be compared satisfy V1in>V2 in, the output from the input/output terminal V1 is high and the output from the input/output terminal V2 is low, whereas if the potentials satisfy V1in<V2in, the output from the input/output terminal V1 is low and the output from the input/output terminal V2 is high. By utilizing such a relationship, the difference between potentials V1in and V2in can be amplified. In the case where the latch sense amplifier is used for the reading circuit, one of the input/output terminals V1 and V2 is connected to the terminal A and an output terminal through a switch, and the reference potential Vref is supplied to the other of the input/output terminals V1 and V2.

With the use of the transistor described in the above embodiment as a writing transistor of a memory cell in the above-described semiconductor device which can be used as a memory device, a short channel effect of the writing transistor can be suppressed, and miniaturization can be achieved. Accordingly, higher integration of a semiconductor device which can be used as a memory device can be achieved.

The structures, methods, and the like described in this embodiment can be combined as appropriate with any of the structures, methods, and the like described in the other embodiments.

Embodiment 5

In this embodiment, an example of application of a semiconductor device according to one embodiment of the invention disclosed herein will be described with reference to FIG. 11. Here, a central processing unit (CPU) will be described.

Figure 11:
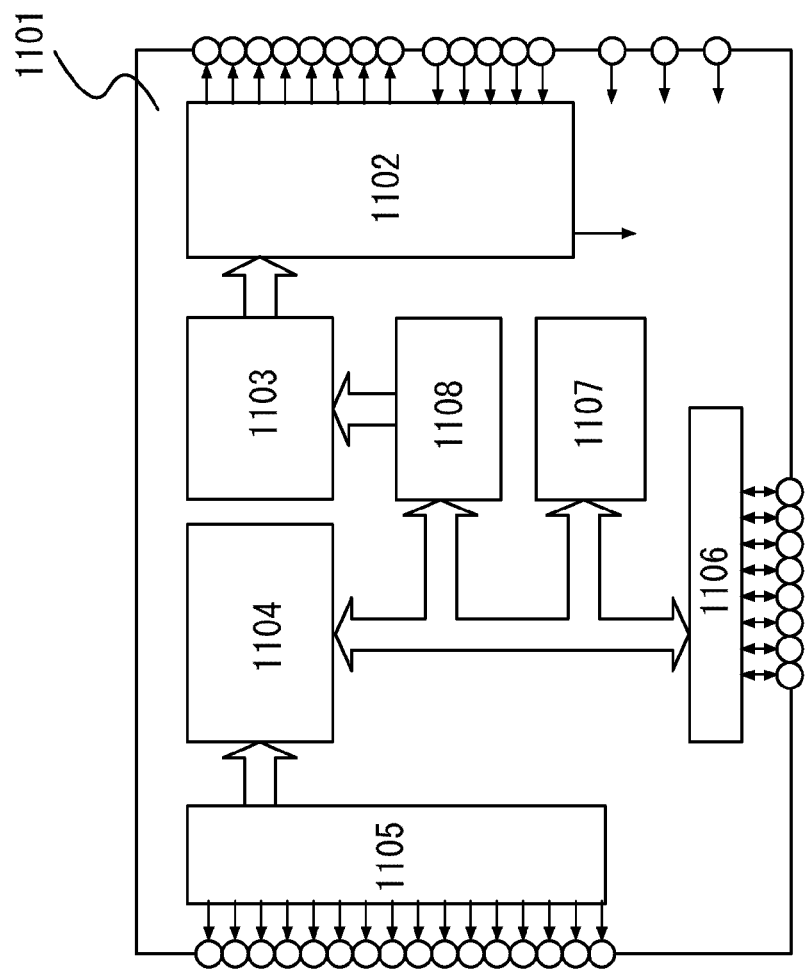
FIG. 11 shows an application example of a semiconductor device.

FIG. 11 illustrates an example of a block diagram of a CPU. A CPU 1101 illustrated in FIG. 11 includes a timing control circuit 1102, an instruction decoder 1103, a register array 1104, an address logic and buffer circuit 1105, a data bus interface 1106, an arithmetic logic unit (ALU) 1107, an instruction register 1108, and the like.

These circuits are manufactured using the transistor described in the above embodiment, an inverter circuit, a resistor, a capacitor, and the like. Since the transistor described in the above embodiment can achieve an extremely small off-state current, a reduction in power consumption of the CPU 1101 can be realized. Furthermore, with the use of the transistor described in the above embodiment, a short channel effect of the transistor can be suppressed, and miniaturization can be achieved.

Circuits included in the CPU 1101 to which Vcc, GND, System Clock and the like are input from the outside will be briefly described below. The timing control circuit 1102 receives instructions (Interrupt Request, Non Maskable Interrupt, Wait, Bus Request, Reset and the like) from the outside, converts the instructions into information for the inside, and transmits the information to another block. In addition, the timing control circuit 1102 gives directions such as reading and writing of memory data (Halt State, Memory Request, I/O Request, Read, Write, Bus Acknowledge, Machine Cycle 1, Refresh and the like) to the outside, according to internal operation. The instruction decoder 1103 functions to convert instructions from the outside into instructions for the inside. The register array 1104 functions to temporarily store data. The address logic and buffer circuit 1105 electrically connects to the System Address Bus and functions to specify the address of an external memory. The data bus interface 1106 electrically connects to the System Data Bus and functions to take data in and out of an external memory or a device such as a printer. The ALU 1107 functions to perform an operation. The instruction register 1108 functions to temporarily store instructions. The CPU includes such a combination of circuits.

With the use of the transistor described in the above embodiment in at least a part of the CPU 1101, a short channel effect of the transistor can be suppressed, and miniaturization can be achieved. Thus, higher integration of the CPU 1101 can be achieved.

The structures, methods, and the like described in this embodiment can be combined as appropriate with any of the structures, methods, and the like described in the other embodiments.

Embodiment 6

In this embodiment, an example of application of a semiconductor device according to one embodiment of the invention disclosed herein will be described with reference to FIGS. 12A and 12B. Here, an example of a semiconductor device having an image sensor function for reading information of an object will be described. Note that in some circuit diagrams, "OS" is written beside a transistor in order to indicate that the transistor includes an oxide semiconductor.

Figure 12A:
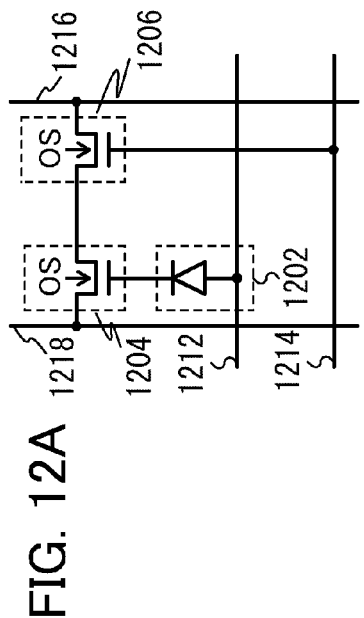
FIGS. 12A and 12B show an application example of a semiconductor device.

FIG. 12A illustrates an example of a semiconductor device having an image sensor function. FIG. 12A is an equivalent circuit diagram of a photosensor, and FIG. 12B is a cross-sectional view of a part of the photosensor.

One electrode of a photodiode 1202 is electrically connected to a photodiode reset signal line 1212, and the other electrode of the photodiode 1202 is electrically connected to a gate of a transistor 1204. One of a source electrode and a drain electrode of the transistor 1204 is electrically connected to a photosensor reference signal line 1218, and the other of the source electrode and the drain electrode of the transistor 1204 is electrically connected to one of a source electrode and a drain electrode of a transistor 1206. A gate electrode of the transistor 1206 is electrically connected to a gate signal line 1214, and the other of the source electrode and the drain electrode of the transistor 1206 is electrically connected to a photosensor output signal line 1216.

Here, transistors including an oxide semiconductor are used as the transistor 1204 and the transistor 1206 illustrated in FIG. 12A. Here, the transistor described in the above embodiment can be used as the transistor including an oxide semiconductor. Since the transistor described in the above embodiment can achieve an extremely small leakage current in an off state, the photodetection accuracy of the photosensor can be improved. Furthermore, with the use of the transistor described in the above embodiment, a short channel effect of the transistor can be suppressed, and miniaturization can be achieved. Thus, the area of the photodiode can be increased, and the photodetection accuracy of the photosensor can be improved.

Figure 12B:
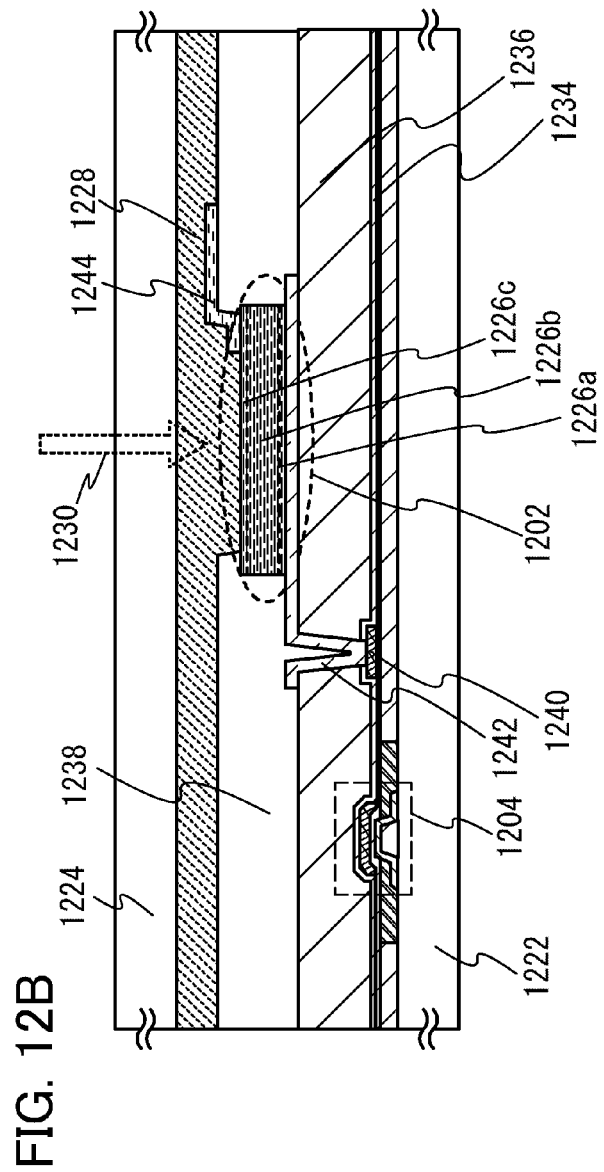

FIG. 12B is a cross-sectional view illustrating the photodiode 1202 and the transistor 1204 in the photosensor. The photodiode 1202 functioning as a sensor and the transistor 1204 are provided over a substrate 1222 having an insulating surface (a TFT substrate). A substrate 1224 is provided over the photodiode 1202 and the transistor 1204 with an adhesive layer 1228. In addition, an insulating film 1234, an interlayer insulating film 1236, and an interlayer insulating film 1238 are provided over the transistor 1204.

In addition, a gate electrode layer 1240 is provided in the same layer as the gate electrode of the transistor 1204 so as to be electrically connected to the gate electrode. The gate electrode layer 1240 is electrically connected to an electrode layer 1242 provided over the interlayer insulating film 1236, through an opening formed in the insulating film 1234 and the interlayer insulating film 1236. Since the photodiode 1202 is formed over the electrode layer 1242, the photodiode 1202 and the transistor 1204 are electrically connected to each other through the gate electrode layer 1240 and the electrode layer 1242.

The photodiode 1202 has a structure in which a first semiconductor layer 1226a, a second semiconductor layer 1226b, and a third semiconductor layer 1226c are stacked in this order over the electrode layer 1242. In other words, the photodiode 1202 is electrically connected to the electrode layer 1242 through the first semiconductor layer 1226a. In addition, the photodiode 1202 is electrically connected to an electrode layer 1244 over the interlayer insulating film 1238 through the third semiconductor layer 1226c.

Here, a PIN photodiode is given as an example, in which a semiconductor layer having n-type conductivity as the first semiconductor layer 1226a, a high-resistance semiconductor layer (an i-type semiconductor layer) as the second semiconductor layer 1226b, and a semiconductor layer having p-type conductivity as the third semiconductor layer 1226c are stacked.

The first semiconductor layer 1226a is an n-type semiconductor layer and is formed from an amorphous silicon film containing an impurity element imparting n-type conductivity. In the formation of the first semiconductor layer 1226a, a plasma CVD method with the use of a semiconductor source gas containing an impurity element belonging to Group 15 (e.g., phosphorus (P)) is employed. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Alternatively, an amorphous silicon film which does not contain an impurity element may be formed, and then, an impurity element may be introduced into the amorphous silicon film by a diffusion method or an ion implantation method. After the impurity element is introduced by an ion implantation method or the like, heating or the like may be conducted in order to diffuse the impurity element. In this case, as a method for forming the amorphous silicon film, an LPCVD method, a vapor deposition method, a sputtering method, or the like may be used. The first semiconductor layer 1226a is preferably formed so as to have a thickness of more than or equal to 20 nm and less than or equal to 200 nm.

The second semiconductor layer 1226b is an i-type semiconductor layer (an intrinsic semiconductor layer) and is formed from an amorphous silicon film. In the formation of the second semiconductor layer 1226b, the amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 1226b may alternatively be formed by an LPCVD method, a vapor deposition method, a sputtering method, or the like. The second semiconductor layer 1226b is preferably formed so as to have a thickness of more than or equal to 200 nm and less than or equal to 1000 nm.

The third semiconductor layer 1226c is a p-type semiconductor layer and can be formed from an amorphous silicon film containing an impurity element imparting p-type conductivity. In the formation of the third semiconductor layer 1226c, a plasma CVD method with the use of a semiconductor source gas containing an impurity element belonging to Group 13 (e.g., boron (B)) is employed. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Alternatively, an amorphous silicon film which does not contain an impurity element may be formed, and then, an impurity element may be introduced into the amorphous silicon film by a diffusion method or an ion implantation method. After the impurity element is introduced by an ion implantation method or the like, heating or the like may be performed in order to diffuse the impurity element. In this case, as a method for forming the amorphous silicon film, an LPCVD method, a vapor deposition method, a sputtering method, or the like may be used. The third semiconductor layer 1226c is preferably formed so as to have a thickness of more than or equal to 10 nm and less than or equal to 50 nm.

The first semiconductor layer 1226a, the second semiconductor layer 1226b, and the third semiconductor layer 1226c are not necessarily formed using an amorphous semiconductor, and they may be formed using a polycrystalline semiconductor or a microcrystalline semiconductor (a semi-amorphous semiconductor (SAS)).

The microcrystalline semiconductor belongs to a metastable state which is an intermediate state between an amorphous state and a single crystal state according to Gibbs free energy. That is, the microcrystalline semiconductor is a semiconductor having a third state which is stable in terms of free energy and has a short range order and lattice distortion. In the microcrystalline semiconductor, columnar or needle-like crystals grow in a normal direction with respect to a surface of a substrate. The Raman spectrum of microcrystalline silicon, which is a typical example of the microcrystalline semiconductor, is shifted to a smaller wavenumber region than 520 $cm^{-1}$ which represents single crystal silicon. That is, the peak of the Raman spectrum of microcrystalline silicon exists between 520 $cm^{-1}$ which represents single crystal silicon and 480 $cm^{-1}$ which represents amorphous silicon. The microcrystalline semiconductor contains at least 1 at. % of hydrogen or halogen to terminate dangling bonds. Moreover, microcrystalline silicon is made to contain a rare gas element such as helium, neon, argon, or krypton to further enhance lattice distortion, whereby stability is increased and a favorable microcrystalline semiconductor film can be obtained.

This microcrystalline semiconductor film can be formed by a high-frequency plasma CVD method with a frequency of several tens of megahertz to several hundreds of megahertz or a microwave plasma CVD method with a frequency of 1 GHz or higher. Typically, the microcrystalline semiconductor film can be formed using a gas obtained by diluting a silicon hydride, such as $SiH_4$, $Si_2H_6$, $SiH_2Cl_2$, $SiHCl_3$, $SiCl_4$, or $SiF_4$, with hydrogen. Alternatively, the microcrystalline semiconductor film can be formed using a gas containing a silicon hydride and hydrogen which is diluted with one or more rare gas elements selected from helium, argon, krypton, and neon. In that case, the flow ratio of hydrogen to silicon hydride is 5:1 to 200:1, preferably 50:1 to 150:1, further preferably 100:1. Furthermore, a gas containing silicon may be mixed with a carbide gas such as $CH_4$ or $C_2H_6$, a germanium gas such as $GeH_4$ or $GeF_4$, $F_2$, or the like.

In addition, the mobility of holes generated by the photoelectric effect is lower than the mobility of electrons. Therefore, a PIN photodiode has better characteristics when a surface on the p-type semiconductor film side is used as a light-receiving plane. Here, an example where the photodiode 1202 receives incident light 1230 from the substrate 1224 side and converts it into electric signals is described. Further, light from the semiconductor film having a conductivity type opposite to that of the semiconductor film on the light-receiving plane is disturbance light; therefore, the electrode layer 1242 is preferably formed using a light-blocking conductive film. Note that the n-type semiconductor film side may alternatively be a light-receiving plane.

In addition, when the incident light 1230 enters from the substrate 1224 side, an oxide semiconductor layer of the transistor 1204 can be shielded from the incident light 1230 by the gate electrode of the transistor 1204.

The insulating film 1234, the interlayer insulating film 1236, and the interlayer insulating film 1238 can be formed using an insulating material by a film formation method such as a sputtering method, an SOG method, a spin coating method, a dipping method, a spray coating method, or a droplet discharge method (e.g., an ink-jet method, screen printing, or offset printing), or with a tool such as a doctor knife, a roll coater, a curtain coater, or a knife coater, depending on the material.

The insulating film 1234 may be a single layer or stacked layers of an inorganic insulating material, using any of oxide insulating films or nitride insulating films such as a silicon oxide layer, a silicon oxynitride layer, a silicon nitride layer, a silicon nitride oxide layer, an aluminum oxide layer, an aluminum oxynitride layer, an aluminum nitride layer, or an aluminum nitride oxide layer. In addition, a high-quality insulating film which is dense and has high withstand voltage can be formed by a high-density plasma CVD method using microwaves (2.45 GHz), which is preferable.

For a reduction of surface roughness, an insulating film functioning as a planarizing insulating film is preferably used as the interlayer insulating films 1236 and 1238. For example, the interlayer insulating films 1236 and 1238 can be formed using an organic insulating material having heat resistance such as polyimide, an acrylic resin, a benzocyclobutene resin, polyamide, or an epoxy resin. Other than such organic insulating materials, it is possible to use a single layer or stacked layers of a low dielectric constant material (a low-k material), a siloxane-based resin, phosphosilicate glass (PSG), borophosphosilicate glass (BPSG), or the like.

The photodiode 1202 can read information of an object by detecting the incident light 1230. Note that a light source such as a backlight can be used at the time of reading information of an object.

In the photosensor described above, the transistor described in the above embodiment can be used as the transistor including an oxide semiconductor. Since the transistor described in the above embodiment can achieve an extremely small leakage current in an off state, the photodetection accuracy of the photosensor can be improved. Furthermore, with the use of the transistor described in the above embodiment, a short channel effect of the transistor can be suppressed, and miniaturization can be achieved. Thus, the area of the photodiode can be increased, and the photodetection accuracy of the photosensor can be improved.

The structures, methods, and the like described in this embodiment can be combined as appropriate with any of the structures, methods, and the like described in the other embodiments.

Embodiment 7

In this embodiment, the cases where any of the semiconductor devices described in the above embodiments is applied to electronic devices will be described with reference to FIGS. 13A to 13F. The cases where any of the above-described semiconductor devices is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, and a television set (also referred to as a television or a television receiver) will be described in this embodiment.

Figure 13A:
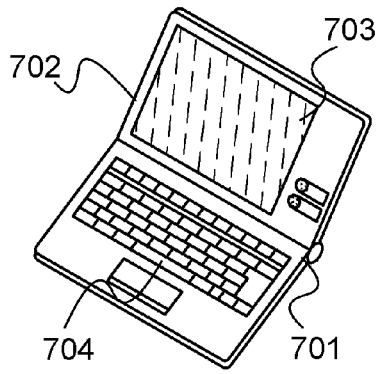
FIGS. 13A to 13F each illustrate an electronic device including a semiconductor device.

FIG. 13A illustrates a laptop personal computer, which includes a housing 701, a housing 702, a display portion 703, a keyboard 704, and the like. At least one of the housings 701 and 702 is provided with any of the semiconductor devices described in the above embodiments. Thus, a laptop personal computer which operates at high speed and consumes low power can be realized for example.

Figure 13D:
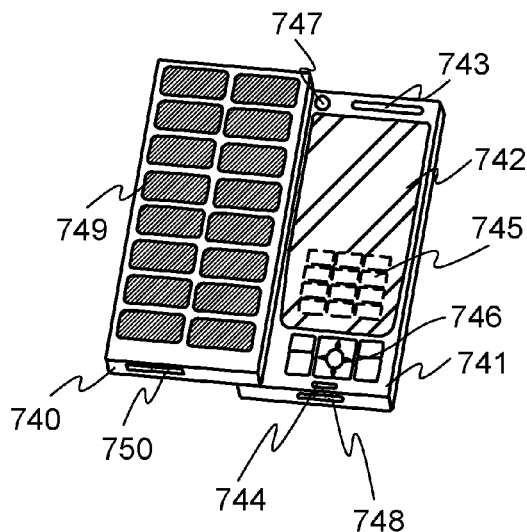
Figure 13B:
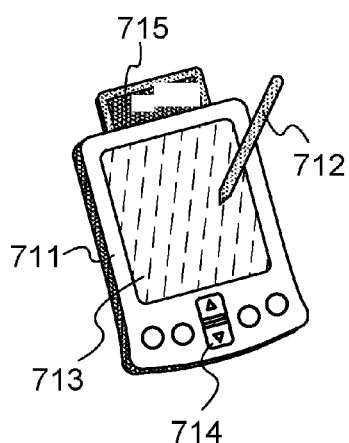

FIG. 13B illustrates a portable information terminal (PDA). A main body 711 is provided with a display portion 713, an external interface 715, operation buttons 714, and the like. Further, a stylus 712 for operation of the portable information terminal, or the like is provided. The main body 711 is provided with any of the semiconductor devices described in the above embodiments. Thus, a portable information terminal which operates at high speed and consumes low power can be realized for example.

Figure 13E:
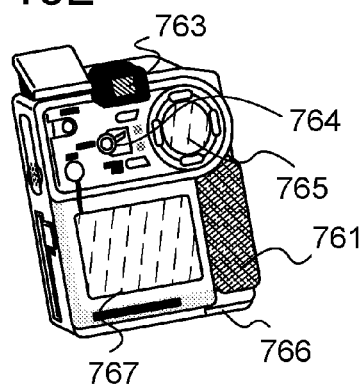
Figure 13C:
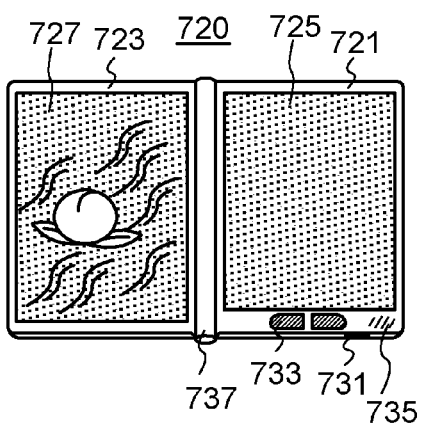

FIG. 13C illustrates an electronic book reader 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book reader 720 can be opened and closed using the hinge 737 as an axis. In addition, the housing 721 is provided with a power switch 731, operation keys 733, a speaker 735, and the like. At least one of the housings 721 and 723 is provided with any of the semiconductor devices described in the above embodiments. Thus, an electronic book reader which operates at high speed and consumes low power can be realized for example.

FIG. 13D illustrates a mobile phone set, which includes two housings, a housing 740 and a housing 741. Moreover, the housings 740 and 741 in a state where they are developed as illustrated in FIG. 13D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. At least one of the housings 740 and 741 is provided with any of the semiconductor devices described in the above embodiments. Thus, a mobile phone set which operates at high speed and consumes low power can be realized for example.

FIG. 13E illustrates a digital camera, which includes a main body 761, a display portion 767, an eyepiece 763, an operation switch 764, a display portion 765, a battery 766, and the like. The main body 761 is provided with any of the semiconductor devices described in the above embodiments. Thus, a digital camera which operates at high speed and consumes low power can be realized for example.

Figure 13F:
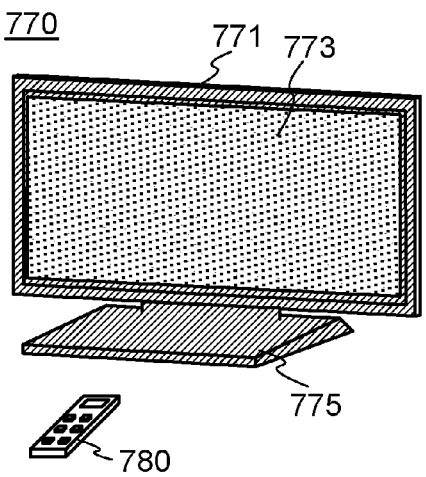

FIG. 13F illustrates a television set 770, which includes a housing 771, a display portion 773, a stand 775, and the like. The television set 770 can be operated with a switch included in the housing 771 or with a remote controller 780. The housing 771 and the remote controller 780 are provided with any of the semiconductor devices described in the above embodiments. Thus, a television set which operates at high speed and consumes low power can be realized for example.

As described above, the electronic devices described in this embodiment each include any of the semiconductor devices according to the above embodiments. Thus, electronic devices whose high-speed operation and low power consumption can be realized by miniaturization of the semiconductor device can be obtained.

This application is based on Japanese Patent Application serial no. 2010-176291 filed with Japan Patent Office on Aug. 5, 2010, the entire contents of which are hereby incorporated by reference.

What is claimed is:

1. A manufacturing method of a semiconductor device comprising the steps of:
    forming an insulating film over a surface of a substrate;
    forming a first mask over the insulating film;
    performing a slimming process on the first mask, so that a second mask is formed;
    performing an etching process on the insulating film using the second mask, so that an insulating layer is formed;
    forming an oxide semiconductor layer covering the insulating layer;
    forming a conductive film covering the oxide semiconductor layer;
    performing a polishing process on the conductive film, so that a surface of the conductive film is flattened;
    performing an etching process on the conductive film, so that a conductive layer is formed and a surface of the conductive layer is lower than a surface of an uppermost part of the oxide semiconductor layer;
    forming a gate insulating film in contact with the conductive layer and the oxide semiconductor layer; and
    forming a gate electrode in a region which is over the gate insulating film and overlaps with the insulating layer.

2. The manufacturing method of the semiconductor device according to claim 1, wherein a step height formed by the surface of the uppermost part of the oxide semiconductor layer and the surface of the conductive layer is more than or equal to 5 nm and less than or equal to 20 nm after performing the etching process on the conductive film.

3. The manufacturing method of the semiconductor device according to claim 1, wherein the polishing process is performed by chemical mechanical polishing.

4. The manufacturing method of the semiconductor device according to claim 1, wherein the surface of the substrate has a root-mean-square roughness of 1 nm or less.

5. The manufacturing method of the semiconductor device according to claim 1, wherein the slimming process is an ashing process using an oxygen radical.

6. The manufacturing method of the semiconductor device according to claim 1, wherein the insulating film is formed by sputtering.

7. A manufacturing method of a semiconductor device comprising the steps of:
    forming an insulating film over a surface of a substrate;
    forming a first mask over the insulating film;
    performing a slimming process on the first mask, so that a second mask is formed;
    performing an etching process on the insulating film using the second mask, so that an insulating layer is formed;
    etching a corner of the insulating layer, so that the corner is rounded;
    forming an oxide semiconductor layer covering the insulating layer;
    forming a conductive film covering the oxide semiconductor layer;
    performing a polishing process on the conductive film, so that a surface of the conductive film is flattened;
    performing an etching process on the conductive film, so that a conductive layer is formed and a surface of the conductive layer is lower than a surface of an uppermost part of the oxide semiconductor layer;
    forming a gate insulating film in contact with the conductive layer and the oxide semiconductor layer; and
    forming a gate electrode in a region which is over the gate insulating film and overlaps with the insulating layer.

8. The manufacturing method of the semiconductor device according to claim 7, wherein a step height formed by the surface of the uppermost part of the oxide semiconductor layer and the surface of the conductive layer is more than or equal to 5 nm and less than or equal to 20 nm after performing the etching process on the conductive film.

9. The manufacturing method of the semiconductor device according to claim 7, wherein the polishing process is performed by chemical mechanical polishing.

10. The manufacturing method of the semiconductor device according to claim 7, wherein the surface of the substrate has a root-mean-square roughness of 1 nm or less.

11. The manufacturing method of the semiconductor device according to claim 7, wherein the slimming process is an ashing process using an oxygen radical.

12. The manufacturing method of the semiconductor device according to claim 7, wherein the insulating film is formed by sputtering.

13. A manufacturing method of a semiconductor device comprising the steps of:
    forming a transistor comprising:
        a channel formation region;
        a first gate insulating film over the channel formation region;
        a first gate electrode which overlaps with the channel formation region and is over the first gate insulating film; and
        a source electrode and a drain electrode electrically connected to the channel formation region;
    forming an interlayer insulating film covering the transistor;

forming an insulating film over the interlayer insulating film;
forming a first mask over the insulating film;
performing a slimming process on the first mask, so that a second mask is formed;
performing an etching process on the insulating film using the second mask, so that an insulating layer is formed;
forming an oxide semiconductor layer covering the insulating layer;
forming a conductive film covering the oxide semiconductor layer;
performing a polishing process on the conductive film, so that a surface of the conductive film is flattened;
performing an etching process on the conductive film, so that a conductive layer is formed and a surface of the conductive layer is lower than a surface of an uppermost part of the oxide semiconductor layer;
forming a second gate insulating film in contact with the conductive layer and the oxide semiconductor layer; and
forming a second gate electrode in a region which is over the second gate insulating film and overlaps with the insulating layer.

14. The manufacturing method of the semiconductor device according to claim 13, wherein a step height formed by the surface of the uppermost part of the oxide semiconductor layer and the surface of the conductive layer is more than or equal to 5 nm and less than or equal to 20 nm after performing the etching process on the conductive film.

15. The manufacturing method of the semiconductor device according to claim 13, wherein the polishing process is performed by chemical mechanical polishing.

16. The manufacturing method of the semiconductor device according to claim 13, wherein a surface on which the interlayer insulating film is formed has a root-mean-square roughness of 1 nm or less.

17. The manufacturing method of the semiconductor device according to claim 13, wherein the slimming process is an ashing process using an oxygen radical.

18. The manufacturing method of the semiconductor device according to claim 13, wherein the insulating film is formed by sputtering.

19. A manufacturing method of a semiconductor device comprising the steps of:
forming a transistor comprising:
a channel formation region;
a first gate insulating film over the channel formation region;
a first gate electrode which overlaps with the channel formation region and is over the first gate insulating film; and
a source electrode and a drain electrode electrically connected to the channel formation region;
forming an interlayer insulating film covering the transistor;
forming an insulating film over the interlayer insulating film;
forming a first mask over the insulating film;
performing a slimming process on the first mask, so that a second mask is formed;
performing an etching process on the insulating film using the second mask, so that an insulating layer is formed;
etching a corner of the insulating layer, so that the corner is rounded;
forming an oxide semiconductor layer covering the insulating layer;
forming a conductive film covering the oxide semiconductor layer;
performing a polishing process on the conductive film, so that a surface of the conductive film is flattened;
performing an etching process on the conductive film, so that a conductive layer is formed and a surface of the conductive layer is lower than a surface of an uppermost part of the oxide semiconductor layer;
forming a second gate insulating film in contact with the conductive layer and the oxide semiconductor layer; and
forming a second gate electrode in a region which is over the second gate insulating film and overlaps with the insulating layer.

20. The manufacturing method of the semiconductor device according to claim 19, wherein a step height formed by the surface of the uppermost part of the oxide semiconductor layer and the surface of the conductive layer is more than or equal to 5 nm and less than or equal to 20 nm after performing the etching process on the conductive film.

21. The manufacturing method of the semiconductor device according to claim 19, wherein the polishing process is performed by chemical mechanical polishing.

22. The manufacturing method of the semiconductor device according to claim 19, wherein a surface on which the interlayer insulating film is formed has a root-mean-square roughness of 1 nm or less.

23. The manufacturing method of the semiconductor device according to claim 19, wherein the slimming process is an ashing process using an oxygen radical.

24. The manufacturing method of the semiconductor device according to claim 19, wherein the insulating film is formed by sputtering.

25. A manufacturing method of a semiconductor device comprising the steps of:
forming an insulating film over a surface of a substrate;
forming a first mask over the insulating film;
performing a slimming process on the first mask, so that a second mask is formed;
performing an etching process on the insulating film using the second mask, so that an insulating layer is formed;
forming an oxide semiconductor layer covering the insulating layer;
forming a conductive film covering the oxide semiconductor layer;
forming a planarizing film over the conductive film;
performing an etching process on the planarizing film and the conductive film, so that a conductive layer is formed and a surface of the conductive layer is lower than a surface of an uppermost part of the oxide semiconductor layer;
forming a gate insulating film in contact with the conductive layer and the oxide semiconductor layer; and
forming a gate electrode in a region which is over the gate insulating film and overlaps with the insulating layer.

26. The manufacturing method of the semiconductor device according to claim 25, wherein a step height formed by the surface of the uppermost part of the oxide semiconductor layer and the surface of the conductive layer is more than or equal to 5 nm and less than or equal to 20 nm after performing the etching process on the conductive film.

27. The manufacturing method of the semiconductor device according to claim 25, wherein the surface of the substrate has a root-mean-square roughness of 1 nm or less.

28. The manufacturing method of the semiconductor device according to claim 25, wherein the slimming process is an ashing process using an oxygen radical.

29. The manufacturing method of the semiconductor device according to claim 25, wherein the insulating film is formed by sputtering.

30. A manufacturing method of a semiconductor device comprising the steps of:
- forming an insulating film over a surface of a substrate;
- forming a first mask over the insulating film;
- performing a slimming process on the first mask, so that a second mask is formed;
- performing an etching process on the insulating film using the second mask, so that an insulating layer is formed;
- etching a corner of the insulating layer, so that the corner is rounded;
- forming an oxide semiconductor layer covering the insulating layer;
- forming a conductive film covering the oxide semiconductor layer;
- forming a planarizing film over the conductive film;
- performing an etching process on the planarizing film and the conductive film, so that a conductive layer is formed and a surface of the conductive layer is lower than a surface of an uppermost part of the oxide semiconductor layer;
- forming a gate insulating film in contact with the conductive layer and the oxide semiconductor layer; and
- forming a gate electrode in a region which is over the gate insulating film and overlaps with the insulating layer.

31. The manufacturing method of the semiconductor device according to claim 30, wherein a step height formed by the surface of the uppermost part of the oxide semiconductor layer and the surface of the conductive layer is more than or equal to 5 nm and less than or equal to 20 nm after performing the etching process on the conductive film.

32. The manufacturing method of the semiconductor device according to claim 30, wherein the surface of the substrate has a root-mean-square roughness of 1 nm or less.

33. The manufacturing method of the semiconductor device according to claim 30, wherein the slimming process is an ashing process using an oxygen radical.

34. The manufacturing method of the semiconductor device according to claim 30, wherein the insulating film is formed by sputtering.

35. A manufacturing method of a semiconductor device comprising the steps of:
- forming a transistor comprising:
  - a channel formation region;
  - a first gate insulating film over the channel formation region;
  - a first gate electrode which overlaps with the channel formation region and is over the first gate insulating film; and
  - a source electrode and a drain electrode electrically connected to the channel formation region;
- forming an interlayer insulating film covering the transistor;
- forming an insulating film over the interlayer insulating film;
- forming a first mask over the insulating film;
- performing a slimming process on the first mask, so that a second mask is formed;
- performing an etching process on the insulating film using the second mask, so that an insulating layer is formed;
- forming an oxide semiconductor layer covering the insulating layer;
- forming a conductive film covering the oxide semiconductor layer;
- forming a planarizing film over the conductive film;
- performing an etching process on the planarizing film and the conductive film, so that a conductive layer is formed and a surface of the conductive layer is lower than a surface of an uppermost part of the oxide semiconductor layer;
- forming a second gate insulating film in contact with the conductive layer and the oxide semiconductor layer; and
- forming a second gate electrode in a region which is over the second gate insulating film and overlaps with the insulating layer.

36. The manufacturing method of the semiconductor device according to claim 35, wherein a step height formed by the surface of the uppermost part of the oxide semiconductor layer and the surface of the conductive layer is more than or equal to 5 nm and less than or equal to 20 nm after performing the etching process on the conductive film.

37. The manufacturing method of the semiconductor device according to claim 35, wherein a surface on which the interlayer insulating film is formed has a root-mean-square roughness of 1 nm or less.

38. The manufacturing method of the semiconductor device according to claim 35, wherein the slimming process is an ashing process using an oxygen radical.

39. The manufacturing method of the semiconductor device according to claim 35, wherein the insulating film is formed by sputtering.

40. A manufacturing method of a semiconductor device comprising the steps of:
- forming a transistor comprising:
  - a channel formation region;
  - a first gate insulating film over the channel formation region;
  - a first gate electrode which overlaps with the channel formation region and is over the first gate insulating film; and
  - a source electrode and a drain electrode electrically connected to the channel formation region;
- forming an interlayer insulating film covering the transistor;
- forming an insulating film over the interlayer insulating film;
- forming a first mask over the insulating film;
- performing a slimming process on the first mask, so that a second mask is formed;
- performing an etching process on the insulating film using the second mask, so that an insulating layer is formed;
- etching a corner of the insulating layer, so that the corner is rounded;
- forming an oxide semiconductor layer covering the insulating layer;
- forming a conductive film covering the oxide semiconductor layer;
- forming a planarizing film over the conductive film;
- performing an etching process on the planarizing film and the conductive film, so that a conductive layer is formed and a surface of the conductive layer is lower than a surface of an uppermost part of the oxide semiconductor layer;
- forming a second gate insulating film in contact with the conductive layer and the oxide semiconductor layer; and
- forming a second gate electrode in a region which is over the second gate insulating film and overlaps with the insulating layer.

41. The manufacturing method of the semiconductor device according to claim 40, wherein a step height formed by the surface of the uppermost part of the oxide semiconductor layer and the surface of the conductive layer is more than or equal to 5 nm and less than or equal to 20 nm after performing the etching process on the conductive film.

42. The manufacturing method of the semiconductor device according to claim 40, wherein a surface on which the interlayer insulating film is formed has a root-mean-square roughness of 1 nm or less.

43. The manufacturing method of the semiconductor device according to claim 40, wherein the slimming process is an ashing process using an oxygen radical.

44. The manufacturing method of the semiconductor device according to claim 40, wherein the insulating film is formed by sputtering.

* * * * *